United States Patent
Yamazaki et al.

(10) Patent No.: US 9,543,445 B2
(45) Date of Patent: Jan. 10, 2017

(54) SEMICONDUCTOR DEVICE WITH OXIDE SEMICONDUCTOR LAYER

(71) Applicant: Semiconductor Energy Laboratory Co., Ltd., Atsugi-shi, Kanagawa-ken (JP)

(72) Inventors: Shunpei Yamazaki, Setagaya (JP); Hiromichi Godo, Isehara (JP); Daisuke Kawae, Kisarazu (JP)

(73) Assignee: Semiconductor Energy Laborartory Co., Ltd., Kanagawa-ken (JP)

( * ) Notice: Subject to any disclaimer, the term of this patent is extended or adjusted under 35 U.S.C. 154(b) by 94 days.

(21) Appl. No.: 14/666,761

(22) Filed: Mar. 24, 2015

(65) Prior Publication Data

US 2015/0194535 A1    Jul. 9, 2015

Related U.S. Application Data

(60) Continuation of application No. 14/151,046, filed on Jan. 9, 2014, now Pat. No. 9,006,025, which is a
(Continued)

(30) Foreign Application Priority Data

Dec. 25, 2009    (JP) .................................. 2009-294738

(51) Int. Cl.
*H01L 29/786* (2006.01)
*H01L 29/423* (2006.01)
(Continued)

(52) U.S. Cl.
CPC ....... *H01L 29/7869* (2013.01); *H01L 29/1033* (2013.01); *H01L 29/42384* (2013.01);
(Continued)

(58) Field of Classification Search
CPC ...................... H01L 29/7869; H01L 29/78696
See application file for complete search history.

(56) References Cited

U.S. PATENT DOCUMENTS 4,335,161 A * 6/1982 Luo ....................... H01L 21/033
148/DIG. 106
5,731,856 A    3/1998 Kim et al.
(Continued)

FOREIGN PATENT DOCUMENTS

EP    1737044 A    12/2006
EP    2226847 A    9/2010
(Continued)

OTHER PUBLICATIONS

Taiwanese Office Action (Application No. 104123763) Dated Mar. 7, 2016.
(Continued)

*Primary Examiner* — Evan Pert
(74) *Attorney, Agent, or Firm* — Robinson Intellectual Property Law Office; Eric J. Robinson

(57) ABSTRACT

A semiconductor device which includes an oxide semiconductor layer, a source electrode and a drain electrode electrically connected to the oxide semiconductor layer, a gate insulating layer covering the oxide semiconductor layer, the source electrode, and the drain electrode, and a gate electrode over the gate insulating layer is provided. The thickness of the oxide semiconductor layer is greater than or equal to 1 nm and less than or equal to 10 nm. The gate insulating layer satisfies a relation where $\in_r/d$ is greater than or equal to 0.08 $(nm^{-1})$ and less than or equal to 7.9 $(nm^{-1})$ when the relative permittivity of a material used for the gate insulating layer is $\in_r$ and the thickness of the gate insulating
(Continued)

layer is d. The distance between the source electrode and the drain electrode is greater than or equal to 10 nm and less than or equal to 1 μm.

20 Claims, 12 Drawing Sheets

Related U.S. Application Data division of application No. 12/974,099, filed on Dec. 21, 2010, now Pat. No. 8,664,652.

(51) Int. Cl.
*H01L 29/49* (2006.01)
*H01L 29/66* (2006.01)
*H01L 29/10* (2006.01)

(52) U.S. Cl.
CPC .... *H01L 29/4908* (2013.01); *H01L 29/66477* (2013.01); *H01L 29/78696* (2013.01)

(56) References Cited

U.S. PATENT DOCUMENTS

| | | | |
|---|---|---|---|
| 5,744,864 A | 4/1998 | Cillessen et al. |
| 5,847,410 A | 12/1998 | Nakajima |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,884,360 B2 | 2/2011 | Takechi et al. |
| 7,935,582 B2 | 5/2011 | Iwasaki |
| 7,943,965 B2 | 5/2011 | Kim et al. |
| 7,956,361 B2 | 6/2011 | Iwasaki |
| 7,977,675 B2 | 7/2011 | Kawamura et al. |
| 7,981,734 B2 | 7/2011 | Furuta et al. |
| 8,021,958 B2 | 9/2011 | Yamazaki et al. |
| 8,154,024 B2 | 4/2012 | Iwasaki |
| 8,193,045 B2 | 6/2012 | Omura et al. |
| 8,268,194 B2 | 9/2012 | Kim et al. |
| 8,278,136 B2 | 10/2012 | Tanaka et al. |
| 8,420,442 B2 | 4/2013 | Takechi et al. |
| 8,513,661 B2 | 8/2013 | Takahashi et al. |
| 8,563,977 B2 | 10/2013 | Shimada et al. |
| 8,642,402 B2 | 2/2014 | Yano et al. |
| 8,785,240 B2 | 7/2014 | Watanabe |
| 8,889,480 B2 | 11/2014 | Takechi et al. |
| 9,209,026 B2 | 12/2015 | Takechi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0056826 A1 | 3/2005 | Appenzeller et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187688 A1 | 8/2007 | Whight et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1 | 2/2009 | Iwasaki |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |

(56) References Cited

U.S. PATENT DOCUMENTS

| | | | |
|---|---|---|---|
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0276689 | A1 | 11/2010 | Iwasaki |
| 2010/0279462 | A1 | 11/2010 | Iwasaki |
| 2012/0132911 | A1 | 5/2012 | Shimada et al. |

FOREIGN PATENT DOCUMENTS

| | | | |
|---|---|---|---|
| EP | 2339639 | A | 6/2011 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 03-101556 | | 10/1991 |
| JP | 05-251705 | A | 9/1993 |
| JP | 08-264794 | A | 10/1996 |
| JP | 08-339974 | A | 12/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2003-298062 | A | 10/2003 |
| JP | 2004-103957 | A | 4/2004 |
| JP | 2004-273614 | A | 9/2004 |
| JP | 2004-273732 | A | 9/2004 |
| JP | 2007-073559 | A | 3/2007 |
| JP | 2007-535164 | | 11/2007 |
| JP | 2008-042088 | A | 2/2008 |
| JP | 2008-153387 | A | 7/2008 |
| JP | 2008-277665 | A | 11/2008 |
| JP | 2008-281988 | A | 11/2008 |
| JP | 2009-260002 | A | 11/2009 |
| JP | 2009-260315 | A | 11/2009 |
| JP | 2009-290113 | A | 12/2009 |
| JP | 2011-082380 | A | 4/2011 |
| KR | 2002-0014201 | A | 2/2002 |
| KR | 2008-0053355 | A | 6/2008 |
| KR | 2008-0076747 | A | 8/2008 |
| TW | 200802888 | | 1/2008 |
| TW | 200903810 | | 1/2009 |
| TW | 200915577 | | 4/2009 |
| TW | 200929546 | | 7/2009 |
| WO | WO-03/081687 | | 10/2003 |
| WO | WO-2004/114391 | | 12/2004 |
| WO | WO-2005/106960 | | 11/2005 |
| WO | WO-2007/029844 | | 3/2007 |
| WO | WO-2007/089046 | | 8/2007 |
| WO | WO-2008/096768 | | 8/2008 |
| WO | WO-2008/100039 | | 8/2008 |
| WO | WO-2008/126879 | | 10/2008 |
| WO | WO-2008/149873 | | 12/2008 |
| WO | WO-2009/041544 | | 4/2009 |
| WO | WO-2009/093722 | | 7/2009 |

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nakamura.M et al., "Syntheses and crystal structures of new homologous compounds, indium iron zinc oxides ($InFeO_3(ZnO)m$) (m natural number) and related compounds" Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

International Search Report (Application No. PCT/JP2010/072185) Dated Jan. 21, 2011.

Written Opinion (Application No. PCT/JP2010/072185) Dated Jan. 21, 2011.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2006, pp. 1067-1069.

Ikeda. T et al., "Full-Functional System Liquid Crystal Display Using CG-Silicon Technology", SID Digest '04 : SID International Symposium Digest of Technical Papers, 2004, vol. 35, pp. 880-883.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-629.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer", Adv. Mater (Advanced Materials), 2006, vol. 18, No. 3, pp. 339-342.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn-Oxide TFTs for Flat Panel Displays", AM-FPD '08 Digest of Technical Papers, Jul. 2, 2008, pp. 251-252, The Japan Society of Appied Physics.

Jeong.J et al., "3.1: Distinguished Paper. 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa Y et al., "UHF RFCPUS on Flexible and Glass Substrates for Secure RFID Systems", Journal of Solid-State Circuits, 2008, vol. 43, No. 1, pp. 292-299.

Ohara H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Appied Physics.

Coates. D et al., "Optical Studies of the Amorphous Liquid-Cholesteric Liquid Crystal Transition:The "Blue Phase"", Physics Letters, Sep. 10, 1973, vol. 45A, No. 2, pp. 115-118.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "68.2:Distinguished Paper.World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0 In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2006, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo. H et al., "P-9:Numerical Analysis on Temperature Dependence of Characteristics of Amorphous In—Ga—Zn-Oxide TFT", SID Digeset '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2008, pp. 284-287.

Miyasaka M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper.Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2005, pp. 663-666.

Kikuchi.H et al., "62.2:Invited Paper.Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stablized Liquid Crystal Blue Phases", Nature Materials, Sep. 2, 2002, vol. 1, pp. 64-68.

Kimizuka N et al., "Spinel, $YbFe_2O_4$, and $Yb_2Fe_3O_7$ Types of Structures for Compounds in the $In_2O_3$ and $Sc_2O_3$—$A_2O_3$—Bo Systems [A: Fe, Ga, or Al; B: Mg, Mn, Fe, Ni, Cu,or Zn] at Temperatures Over 1000° C.", Journal of Solid State Chemistry, 1985, vol. 80, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase", Phys. Rev. A (Physical Review. A), May 1, 1984, vol. 29, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park, Sang-Hee et al., "42.3: Transparent ZnO Thin Film Transitor for the Application of High Aperture Ration Bottom Emission AM-OLED Display", SID Digeset '08 : SID International Symposium Digest of Technical Papers, May 20, 2008, vol. 39, pp. 629-632.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics ) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2006, vol. 87, pp. 122102-1-122102-3.

Oba. F et al., "Defect energetics in ZnO: A hybrid Hartree-Fock density functional study", Phys. Rev. B (Physical Review. B), 2008, vol. 77, pp. 245202-1-245202-8.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW'08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Appiled Physics Letters) , Sep. 1, 2003, vol. 83, No. 9, pp. 1755-1757.

* cited by examiner

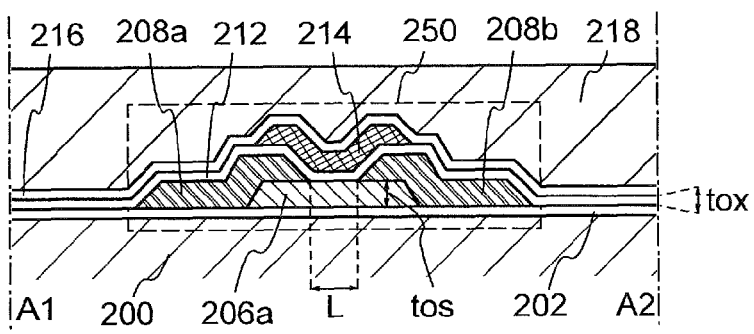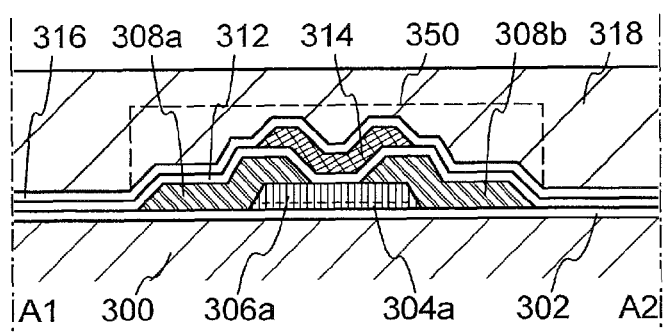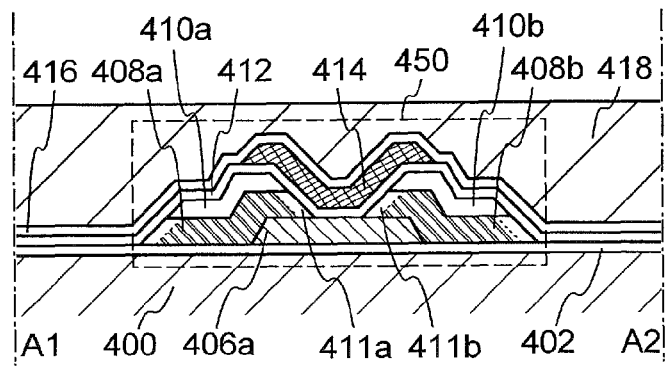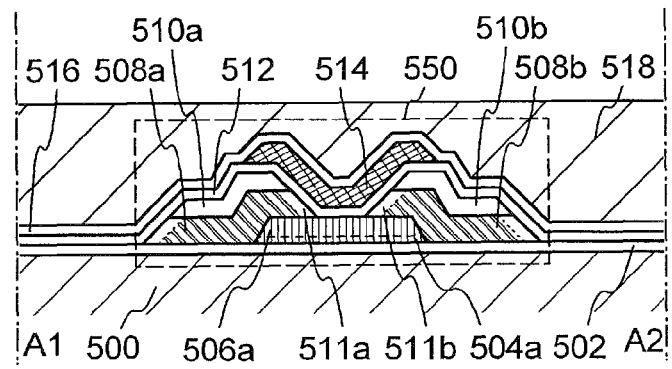

FIG. 7A1
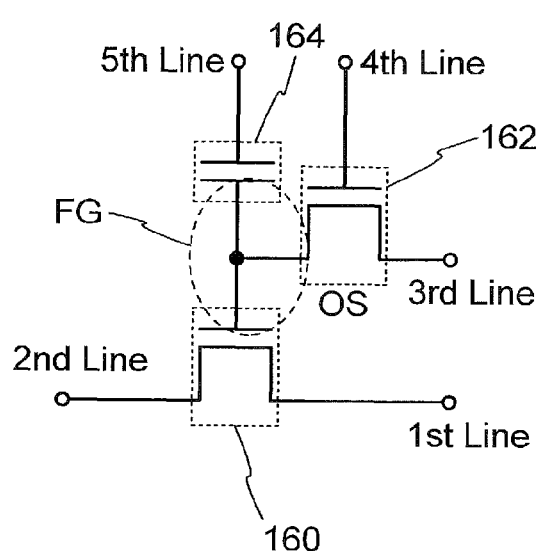
FIG. 7A2
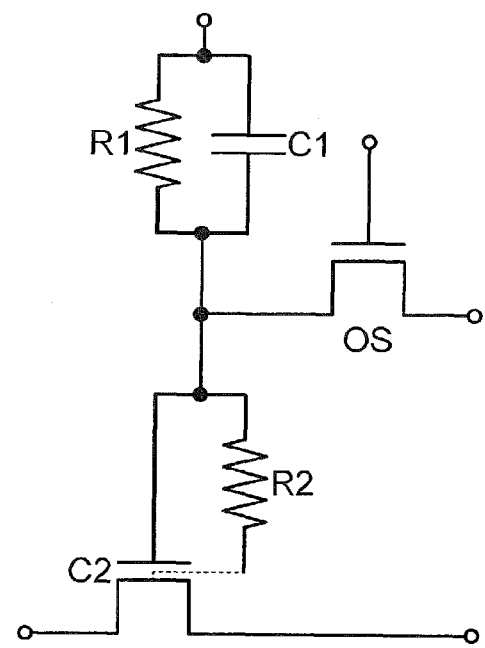
FIG. 7B
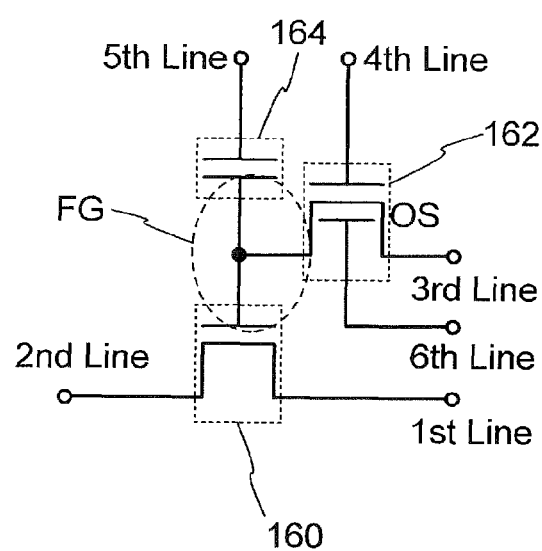

SEMICONDUCTOR DEVICE WITH OXIDE SEMICONDUCTOR LAYER

TECHNICAL FIELD

The technical field of the present invention relates to a semiconductor device and a method for manufacturing the semiconductor device. Note that semiconductor devices herein refer to general elements and devices which function by utilizing semiconductor characteristics.

BACKGROUND ART

There are a wide variety of metal oxides, which are used for various applications. Indium oxide is a well-known material and is used as a material for transparent electrodes which are needed for liquid crystal display devices or the like.

Some metal oxides have semiconductor characteristics. Examples of such metal oxides having semiconductor characteristics include tungsten oxide, tin oxide, indium oxide, zinc oxide, and the like. A thin film transistor in which a channel formation region is formed using such a metal oxide is already known (for example, see Patent Documents 1 to 4, Non-Patent Document 1, and the like).

Not only single-component oxides but also multi-component oxides are known as metal oxides. For example, $InGaO_3(ZnO)_m$ (m is a natural number) having a homologous series is known as a multi-component oxide semiconductor including In, Ga, and Zn (for example, see Non-Patent Documents 2 to 4 and the like).

In addition, it is confirmed that an oxide semiconductor including such an In—Ga—Zn-based oxide can also be applied to a channel formation region of a thin film transistor (for example, see Patent Document 5, Non-Patent Documents 5 and 6, and the like).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun., 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

DISCLOSURE OF INVENTION

In order to achieve high-speed operation, low power consumption, cost reduction, or the like of a transistor, it is necessary to miniaturize a transistor.

In the case where a transistor is miniaturized, a short-channel effect becomes a major problem. Here, the short-channel effect refers to degradation of electrical characteristics which becomes obvious with miniaturization of a transistor (a reduction in channel length (L)). The short-channel effect results from the effect of an electric field of a drain on a source. Specific examples of the short-channel effect are a decrease in threshold voltage, an increase in subthreshold swing (S value), an increase in leakage current, and the like.

An oxide semiconductor has low carrier density, and a short-channel effect such as a decrease in threshold voltage is likely to be caused. Therefore, a problem which has not been so far caused in the case of a transistor including a material such as silicon might arise.

In view of this, it is an object of one embodiment of the disclosed invention to provide a semiconductor device which maintains favorable characteristics, achieves miniaturization, and includes an oxide semiconductor.

For example, one embodiment of the disclosed invention is a semiconductor device which includes an oxide semiconductor layer; a source electrode and a drain electrode electrically connected to the oxide semiconductor layer; a gate insulating layer covering the oxide semiconductor layer, the source electrode, and the drain electrode; and a gate electrode over the gate insulating layer. The thickness of the oxide semiconductor layer is greater than or equal to 1 nm and less than or equal to 10 nm. The gate insulating layer satisfies a relation where $\in_r/d$ is greater than or equal to 0.08 (nm$^{-1}$) and less than or equal to 7.9 (nm$^{-1}$) when the relative permittivity of a material used for the gate insulating layer is $\in_r$ and the thickness of the gate insulating layer is d. The distance between the source electrode and the drain electrode is greater than or equal to 10 nm and less than or equal to 1 μm.

In the above structure, the source electrode and the drain electrode each preferably have an oxide region formed by oxidizing side surfaces of the source electrode and the drain electrode. In the above structure, it is preferable that the oxide regions of the source electrode and the drain electrode be formed by plasma treatment with a high frequency power of greater than or equal to 300 MHz and less than or equal to 300 GHz and a mixed gas of oxygen and argon.

In the above structure, the oxide semiconductor layer is preferably supplied with oxygen by the plasma treatment.

In the above structure, it is also preferable that an insulating layer having substantially the same planar shape as the source electrode and the drain electrode be formed over the source electrode and the drain electrode. Here, the expression "substantially the same" does not necessarily mean being exactly the same in a strict sense. For example, such a difference as is made by a single etching process is acceptable.

In the above structure, off current density is preferably 100 zA/μm or less. Here, the term "off current density" means a value obtained in such a manner that off current is divided by the channel width of a transistor.

In the above structure, the semiconductor device is preferably formed on a surface having an arithmetic mean deviation of 1 nm or less.

Another embodiment of the disclosed invention is a method for manufacturing a semiconductor device, which includes the steps of forming an oxide semiconductor layer over a substrate; forming a source electrode and a drain electrode electrically connected to the oxide semiconductor layer; forming a gate insulating layer covering the oxide semiconductor layer, the source electrode, and the drain electrode after oxidizing side surfaces of the source electrode and the drain electrode; and forming a gate electrode over the gate insulating layer.

In the above structure, it is preferable that the side surfaces of the source electrode and the drain electrode be oxidized by plasma treatment with a high frequency power of greater than or equal to 300 MHz and less than or equal to 300 GHz and a mixed gas of oxygen and argon.

In the above structure, the oxide semiconductor layer is preferably supplied with oxygen by the plasma treatment. In the above structure, a process for reducing hydrogen in the oxide semiconductor layer is preferably performed before the plasma treatment.

In the above structure, it is preferable that the thickness of the oxide semiconductor layer be greater than or equal to 1 nm and less than or equal to 10 nm, the gate insulating layer satisfy a relation where $\in_r/d$ is greater than or equal to 0.08 $(nm^{-1})$ and less than or equal to 7.9 $(nm^{-1})$ when the relative permittivity of a material used for the gate insulating layer is $\in_r$, and the thickness of the gate insulating layer is d, and the distance between the source electrode and the drain electrode be greater than or equal to 10 nm and less than or equal to 1 μm.

In the above structure, it is also preferable that an insulating layer having substantially the same planar shape as the source electrode and the drain electrode be formed over the source electrode and the drain electrode.

In the above structure, a substrate whose surface has an arithmetic mean deviation of 1 nm or less is preferably used for the substrate of the semiconductor device.

Note that in this specification and the like, the term such as "over" or "below" does not necessarily mean that a component is placed "directly on" or "directly under" another component. For example, the expression "a gate electrode over a gate insulating layer" does not exclude the case where a component is placed between the gate insulating layer and the gate electrode layer. Moreover, the terms such as "over" and "below" are only used for convenience of description and can include the case where the positions of components are reversed, unless otherwise specified.

In addition, in this specification and the like, the term such as "electrode" or "wiring" does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" are formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

According to one embodiment the disclosed invention, the thicknesses of the oxide semiconductor layer and the gate insulating layer, the distance between the source electrode and the drain electrode, and the like are in their respective predetermined ranges, whereby a semiconductor device which maintains favorable characteristics and achieves miniaturization can be provided.

In the case where oxygen is supplied to an oxide semiconductor layer and side surfaces of a source electrode and a drain electrode are oxidized, it is possible to prevent short circuit between a gate electrode and the source or drain electrode which may be caused by a reduction in thickness of a gate insulating layer or defective coverage therewith.

In the case where an insulating layer is provided over the source electrode and the drain electrode, capacitance formed between the gate electrode and the source electrode and between the gate electrode and the drain electrodes is reduced, whereby the semiconductor device can operate at further high speed.

In this manner, according to one embodiment of the disclosed invention, a semiconductor device which maintains favorable characteristics and achieves miniaturization can be provided.

BRIEF DESCRIPTION OF DRAWINGS

FIGS. 1A to 1D are cross-sectional views of semiconductor devices.

FIGS. 7A1, 7A2, and 7B are circuit diagrams of semiconductor devices.

BEST MODE FOR CARRYING OUT THE INVENTION

Figure 2A:
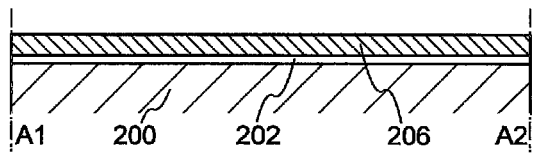
FIGS. 2A to 2E are cross-sectional views illustrating manufacturing steps of a semiconductor device.
Figure 2B:
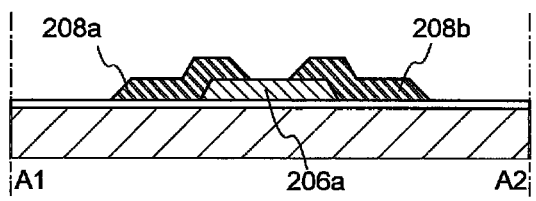

Hereinafter, embodiments of the present invention will be described with reference to the drawings. Note that the present invention is not limited to the following description and it will be easily understood by those skilled in the art that modes and details can be modified in various ways without departing from the spirit and the scope of the present invention. Therefore, the present invention should not be interpreted as being limited to the description of the embodiments below.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a structure of a semiconductor device according to one embodiment of the disclosed invention will be described with reference to FIGS. 1A to 1D. Note that although a top-gate transistor is described as an example, the structure of a transistor is not limited to a top-gate structure.

FIG. 1A illustrates an example of a structure of a semiconductor device. A transistor 250 includes an oxide semiconductor layer 206a provided over a substrate 200; a source or drain electrode 208a and a source or drain electrode 208b electrically connected to the oxide semiconductor layer 206a; a gate insulating layer 212 provided so as to cover the oxide semiconductor layer 206a, the source or drain electrode 208a, and the source or drain electrode 208b; and a gate electrode 214 provided over the gate insulating layer 212 so as to overlap with the oxide semiconductor layer 206a. An interlayer insulating layer 216 and an interlayer insulating layer 218 are provided so as to cover the transistor 250. Note that an insulating layer 202 serving as a base may be provided between the substrate 200 and the oxide semiconductor layer 206a.

In the transistor 250, the oxide semiconductor layer 206a has an amorphous structure. The channel length (L) of the transistor 250 is set to greater than or equal to 10 nm and less than or equal to 1000 nm, preferably greater than or equal to 10 nm and less than or equal to 70 nm. This is because advantageous effects such as high-speed operation and low power consumption can be obtained when the channel length of the transistor is shortened. The thickness (tos) of the oxide semiconductor layer 206a is set to greater than or equal to 1 nm and less than or equal to 50 nm, preferably greater than or equal to 1 nm and less than or equal to 30 nm, more preferably greater than or equal to 1 nm and less than or equal to 10 nm (for example, greater than or equal to 3 nm and less than or equal to 10 nm). This is because a short-channel effect due to miniaturization can be suppressed when the oxide semiconductor layer 206a having such a thickness is used.

The thickness (tox) of the gate insulating layer 212 may be set to such a thickness as satisfies a relation where $\in_r/d$ is greater than or equal to 0.08 (nm$^{-1}$) and less than or equal to 7.9 (nm$^{-1}$), preferably greater than or equal to 0.26 (nm$^{-1}$) and less than or equal to 7.9 (nm$^{-1}$), more preferably greater than or equal to 1.3 (nm$^{-1}$) and less than or equal to 7.9 (nm$^{-1}$) when the relative permittivity of a material used for the gate insulating layer 212 is $\in_r$ and the thickness of the gate insulating layer 212 is d. When the above relation is satisfied, operation of the transistor can be sufficiently ensured. For example, in the case where the gate insulating layer 212 is formed using silicon oxide (the relative permittivity is assumed to be about 3.9), the thickness of the gate insulating layer 212 can be set to greater than or equal to 0.5 nm and less than or equal to 50 nm, preferably greater than or equal to 0.5 nm and less than or equal to 15 nm, more preferably greater than or equal to 0.5 nm and less than or equal to 3 nm.

Note that as the material for the gate insulating layer 212, a material with a high dielectric constant (a high-k material) such as hafnium oxide or tantalum oxide is preferably used. With the use of such a material, the above relation can be satisfied even when the thickness of the gate insulating layer 212 is sufficiently ensured, and gate leakage can be suppressed without sacrificing the operation of the transistor.

FIG. 1B illustrates a modification example of the semiconductor device in FIG. 1A. A transistor 350 includes a first oxide semiconductor layer 304a and a second oxide semiconductor layer 306a provided over a substrate 300; a source or drain electrode 308a and a source or drain electrode 308b electrically connected to the first oxide semiconductor layer 304a and the second oxide semiconductor layer 306a; a gate insulating layer 312 provided so as to cover the second oxide semiconductor layer 306a, the source or drain electrode 308a, and the source or drain electrode 308b; and a gate electrode 314 provided over the gate insulating layer 312 so as to overlap with the second oxide semiconductor layer 306a. An interlayer insulating layer 316 and an interlayer insulating layer 318 are provided so as to cover the transistor 350. Note that an insulating layer 302 serving as a base may be provided between the substrate 300 and the first oxide semiconductor layer 304a.

The structure illustrated in FIG. 1B and the structure illustrated in FIG. 1A are different from each other in crystallinity of the oxide semiconductor layer. The crystallinity of the oxide semiconductor layer 206a in FIG. 1A is amorphous, whereas the first oxide semiconductor layer 304a and the second oxide semiconductor layer 306a in FIG. 1B each have a structure in which a crystal region is provided. The crystal region has an a-b plane which is substantially parallel to a surface of the oxide semiconductor layer, and includes a crystal which is c-axis-aligned in a direction substantially perpendicular to the surface in some cases. Here, a "substantially parallel direction" means a direction within ±10° from a parallel direction, and a "substantially perpendicular direction" means a direction within ±10° from a perpendicular direction.

As illustrated in FIG. 1B, with the use of the oxide semiconductor layer having a crystal region for the transistor, a field-effect mobility $\mu > 100$ cm$^2$/V·s can be achieved. Therefore, the semiconductor device illustrated in FIG. 1B is suitable for a logic circuit where high-speed operation is required.

The conditions such as the channel length of the transistor, the thickness of the oxide semiconductor layer, and the thickness of the gate insulating layer are the same as those in FIG. 1A.

Note that although the case where the oxide semiconductor layer has a two-layer structure is illustrated in FIG. 1B, one embodiment of the disclosed invention is not limited to this structure. In the case where a required thickness can be ensured by only the first oxide semiconductor layer 304a, the second oxide semiconductor layer 306a is unnecessary. That is, the oxide semiconductor layer may have a single-layer structure of an oxide semiconductor layer having a crystal region.

FIG. 1C illustrates a modification example of the semiconductor device in FIG. 1A. A transistor 450 includes an oxide semiconductor layer 406a provided over a substrate 400; a source or drain electrode 408a and a source or drain electrode 408b electrically connected to the oxide semiconductor layer 406a; an insulating layer 410a and an insulating layer 410b provided so as to cover upper portions of the source or drain electrode 408a and the source or drain electrode 408b; a gate insulating layer 412 provided so as to cover the oxide semiconductor layer 406a, the source or drain electrode 408a, the source or drain electrode 408b, and the like; and a gate electrode 414 provided over the gate insulating layer 412 so as to overlap with the oxide semiconductor layer 406a. An interlayer insulating layer 416 and an interlayer insulating layer 418 are provided so as to cover the transistor 450. Note that an insulating layer 402 serving as a base may be provided between the substrate 400 and the oxide semiconductor layer 406a.

The structure illustrated in FIG. 1C is different from the structure illustrated in FIG. 1A in existence of the insulating layer 410a and the insulating layer 410b. When the insulating layer 410a and the insulating layer 410b are provided, capacitance formed between the gate electrode 414 and the source or drain electrode 408a and between the gate electrode 414 and the source or drain electrode 408b can be reduced.

The source or drain electrode 408a and the source or drain electrode 408b respectively have an oxide region 411a and an oxide region 411b in portions where the source or drain electrode 408a and the source or drain electrode 408b are in contact with the gate insulating layer 412. With the oxide regions, it is possible to prevent short circuit between the gate electrode 414 and the source or drain electrode 408a and between the gate electrode 414 and the source or drain electrode 408b which may be caused by a reduction in thickness of the gate insulating layer or defective coverage therewith. Further, it is possible to reduce an electric field at the interface between the oxide semiconductor layer 406a and the source or drain electrode 408a and the interface between the oxide semiconductor layer 406a and the source or drain electrode 408b.

The conditions such as the channel length of the transistor, the thickness of the oxide semiconductor layer, and the thickness of the gate insulating layer are the same as those in FIG. 1A.

FIG. 1D illustrates a modification example of the semiconductor device in FIG. 1B. Alternatively, FIG. 1D illustrates a modification example of the semiconductor device in FIG. 1C. A transistor 550 includes a first oxide semiconductor layer 504a and a second oxide semiconductor layer 506a provided over a substrate 500; a source or drain electrode 508a and a source or drain electrode 508b electrically connected to the first oxide semiconductor layer 504a and the second oxide semiconductor layer 506a; an insulating layer 510a and an insulating layer 510b provided so as to cover upper portions of the source or drain electrode 508a and the source or drain electrode 508b; a gate insulating layer 512 provided so as to cover the second oxide semiconductor layer 506a, the source or drain electrode 508a, the source or drain electrode 508b, and the like; and a gate electrode 514 provided over the gate insulating layer 512 so as to overlap with the second oxide semiconductor layer 506a. An interlayer insulating layer 516 and an interlayer insulating layer 518 are provided so as to cover the transistor 550. Note that an insulating layer 502 serving as a base may be provided between the substrate 500 and the second oxide semiconductor layer 506a.

The structure illustrated in FIG. 1D is different from the structure illustrated in FIG. 1B in existence of the insulating layer 510a and the insulating layer 510b. When the insulating layer 510a and the insulating layer 510b are provided, capacitance formed between the gate electrode 514 and the source or drain electrode 508a and between the gate electrode 514 and the source or drain electrode 508b can be reduced.

The source or drain electrode 508a and the source or drain electrode 508b respectively have an oxide region 511a and an oxide region 511b in portions where the source or drain electrode 508a and the source or drain electrode 508b are in contact with the gate insulating layer 512. With the oxide regions, it is possible to prevent short circuit between the gate electrode and the source electrode and between the gate electrode and the drain electrode which may be caused by a reduction in thickness of the gate insulating layer or defective coverage therewith.

The structure illustrated in FIG. 1D and the structure illustrated in FIG. 1C are different from each other in crystallinity of the oxide semiconductor layer. The first oxide semiconductor layer 504a and the second oxide semiconductor layer 506a in FIG. 1D each have a structure in which a crystal region is provided. The crystal region has an a-b plane which is substantially parallel to a surface of the oxide semiconductor layer, and includes a crystal which is c-axis-aligned in a direction substantially perpendicular to the surface in some cases. Here, a "substantially parallel direction" means a direction within ±10° from a parallel direction, and a "substantially perpendicular direction" means a direction within ±10° from a perpendicular direction.

As illustrated in FIG. 1D, with the use of the oxide semiconductor layer having a crystal region for the transistor, a field-effect mobility $\mu > 100$ $cm^2/V \cdot s$ can be achieved. Therefore, the semiconductor device illustrated in FIG. 1D is suitable for a logic circuit where high-speed operation is required.

The conditions such as the channel length of the transistor, the thickness of the oxide semiconductor layer, and the thickness of the gate insulating layer are the same as those in FIG. 1A.

Note that although the case where the oxide semiconductor layer has a two-layer structure is illustrated in FIG. 1D, one embodiment of the disclosed invention is not limited to this structure. In the case where a required thickness can be ensured by only the first oxide semiconductor layer 504a, the second oxide semiconductor layer 506a is unnecessary. That is, the oxide semiconductor layer may have a single-layer structure of an oxide semiconductor layer having a crystal region.

The structure described in this embodiment is suitable for miniaturization. With the use of this structure, a semiconductor device including an oxide semiconductor can maintain favorable characteristics, and can achieve miniaturization.

The structures, methods, and the like described in this embodiment can be combined with any of the structures, methods, and the like described in the other embodiments as appropriate.

Embodiment 2

In this embodiment, a method for manufacturing a semiconductor device including an oxide semiconductor (especially, an amorphous structure) will be described. Specifically, a method for manufacturing the semiconductor device in FIG. 1A will be described with reference to FIGS. 2A to 2E. Note that although a top-gate transistor is described as an example, the structure of a transistor is not limited to a top-gate structure.

First, the insulating layer 202 is formed over the substrate 200. After that, an oxide semiconductor layer 206 is formed over the insulating layer 202 (see FIG. 2A).

As the substrate 200, for example, a glass substrate can be used. As the substrate 200, an insulating substrate formed using an insulator such as a ceramic substrate, a quartz substrate, or a sapphire substrate, a semiconductor substrate which is formed using a semiconductor material such as silicon and whose surface is covered with an insulating material, a conductive substrate which is formed using a conductor such as metal or stainless steel and whose surface is covered with an insulating material, or the like can be used as well as a glass substrate. A substrate formed using plastic or the like generally tends to have a low upper temperature limit, but can be used as the substrate 200 as long as the substrate can withstand processing temperatures in the manufacturing process performed later.

Note that the substrate 200 preferably has an arithmetic mean deviation (Ra) of 1 nm or less. More preferably, the substrate 200 has an arithmetic mean deviation of 0.5 nm or less. The reason of this is as follows: demands for a light-exposure condition of a mask used for patterning are increased in accordance with miniaturization of a semiconductor device, and even in the case where the demands for a light-exposure condition are high, they can be easily met with the use of such a substrate having high planarity. Note that for the above arithmetic mean deviation, for example, a value obtained by the measurement performed on a region of 10 μm×10 μm can be used.

The insulating layer 202 functions as a base and can be formed by a PVD method, a CVD method, or the like. The insulating layer 202 can be formed using a material containing an inorganic insulating material such as silicon oxide, silicon oxynitride, silicon nitride, hafnium oxide, aluminum oxide, or tantalum oxide. Note that it is desirable to form the insulating layer 202 so as to contain hydrogen or water as little as possible. A structure in which the insulating layer 202 is not provided is also possible.

As the oxide semiconductor layer 206, an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor can be used.

In particular, an In—Ga—Zn—O-based oxide semiconductor material has sufficiently high resistance when there is no electric field and thus off current can be sufficiently reduced. In addition, having a high field-effect mobility, the In—Ga—Zn—O-based oxide semiconductor material is suitable for a semiconductor material used in a semiconductor device.

As a typical example of the In—Ga—Zn—O-based oxide semiconductor material, there is an oxide semiconductor material represented by InGaO$_3$(ZnO)$_m$ (m>0). Further, there is an oxide semiconductor material represented by InMO$_3$(ZnO)$_m$ (m>0) when M is used instead of Ga. Here, M denotes one or more metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

As a target for forming the oxide semiconductor layer 206 by a sputtering method, a target having a composition ratio of In:Ga:Zn=1:x:y (x is greater than or equal to 0, and y is greater than or equal to 0.5 and less than or equal to 5) is preferable. For example, a target having a composition ratio of In:Ga:Zn=1:1:1 [atomic ratio] (x=1, y=1) (i.e., In$_2$O$_3$:Ga$_2$O$_3$:ZnO=1:1:2 [molar ratio]) can be used. Alternatively, a target having a composition ratio of In:Ga:Zn=1:1:0.5 [atomic ratio] (x=1, y=0.5) (i.e., In$_2$O$_3$:Ga$_2$O$_3$:ZnO=1:1:1 [molar ratio]); a target having a composition ratio of In:Ga:Zn=1:1:2 (x=1, y=2) [atomic ratio] (i.e., In$_2$O$_3$:Ga$_2$O$_3$:ZnO=1:1:4 [molar ratio]); or a target having a composition ratio of In:Ga:Zn=1:0:1 [atomic ratio] (x=0, y=1) (i.e., In$_2$O$_3$:ZnO=1:2 [molar ratio]) can be used.

In this embodiment, the oxide semiconductor layer 206 having an amorphous structure is formed by a sputtering method using an In—Ga—Zn—O-based metal oxide target.

The relative density of a metal oxide in the metal oxide target is 80% or more, preferably 95% or more, more preferably 99.9% or more. The use of a metal oxide target having high relative density makes it possible to form the oxide semiconductor layer 206 with a dense structure.

The atmosphere in which the oxide semiconductor layer 206 is formed is preferably a rare gas (typically, argon) atmosphere, an oxygen atmosphere, or a mixed atmosphere of a rare gas (typically, argon) and oxygen. Specifically, it is preferable to use a high-purity gas atmosphere from which impurities such as hydrogen, water, hydroxyl, and hydride are removed so that the concentration thereof is decreased to 1 ppm or less (preferably, 10 ppb or less).

At the time of forming the oxide semiconductor layer 206, for example, the substrate is held in a treatment chamber that is kept in a reduced-pressure state, and the substrate is heated to a temperature higher than or equal to 100° C. and lower than 550° C., preferably higher than or equal to 200° C. and lower than or equal to 400° C. Alternatively, the substrate temperature at the time of forming the oxide semiconductor layer 206 may be room temperature. Then, a sputtering gas from which hydrogen, water, and the like are removed is introduced into the treatment chamber while moisture in the treatment chamber is removed, whereby the oxide semiconductor layer 206 is formed using the above-described target. The oxide semiconductor layer 206 is formed while the substrate is heated, so that impurities contained in the oxide semiconductor layer 206 can be reduced. In addition, damage due to the sputtering can be reduced. In order to remove moisture in the treatment chamber, an entrapment vacuum pump is preferably used. For example, a cryopump, an ion pump, a titanium sublimation pump, or the like can be used. Alternatively, a turbo pump provided with a cold trap may be used. With the use of a cryopump or the like, hydrogen, water, and the like can be removed from the treatment chamber; thus, the impurity concentration in the oxide semiconductor layer 206 can be reduced.

For example, the conditions for forming the oxide semiconductor layer 206 can be set as follows: the distance between the substrate and the target is 170 mm, the pressure is 0.4 Pa, the direct-current (DC) power is 0.5 kW, and the atmosphere is an oxygen (100% oxygen) atmosphere, an argon (100% argon) atmosphere, or a mixed atmosphere of oxygen and argon. Note that a pulsed direct-current (DC) power source is preferably used because dust (such as powder substances formed at the time of the film formation) can be reduced and the film thickness can be uniform. The thickness of the oxide semiconductor layer 206 is greater than or equal to 1 nm and less than or equal to 50 nm, preferably greater than or equal to 1 nm and less than or equal to 30 nm, more preferably greater than or equal to 1 nm and less than or equal to 10 nm (for example, greater than or equal to 3 nm and less than or equal to 10 nm). With the use of the oxide semiconductor layer 206 having such a thickness, a short-channel effect due to miniaturization can be suppressed. Note that the appropriate thickness varies depending on the material for the oxide semiconductor, the usage of the semiconductor device, or the like, and thus the thickness can be selected as appropriate depending on the material, the usage, or the like.

Note that before the oxide semiconductor layer 206 is formed by a sputtering method, reverse sputtering in which plasma is generated with an argon gas introduced is preferably performed, so that dust attached to a surface on which the oxide semiconductor layer 206 is formed (e.g., a surface of the insulating layer 202) is removed. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that an atmosphere of nitrogen, helium, oxygen, or the like may be used instead of an argon atmosphere.

Next, the oxide semiconductor layer 206 is processed by a method such as etching using a mask; thus, the island-shaped oxide semiconductor layer 206a is formed.

As a method for etching the oxide semiconductor layer 206, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coil-shaped electrode, the amount of electric power applied to an electrode on the substrate side, and the electrode temperature on the substrate side) are set as appropriate.

As an etchant used for wet etching, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used. An etchant such as ITO-07N (produced by KANTO CHEMICAL CO., INC.) may also be used.

Etching is preferably performed so that an end portion of the oxide semiconductor layer 206a has a tapered shape. Here, the tapered angle is preferably greater than or equal to 30° and less than or equal to 60°, for example. Note that the "tapered angle" means an inclination angle formed by the side surface and the bottom surface of a layer having a tapered shape (e.g., the oxide semiconductor layer 206a) when being observed in a direction perpendicular to the cross section (a plane perpendicular to the surface of a substrate). The etching is performed so that the end portion of the oxide semiconductor layer 206a has a tapered shape, whereby coverage with the source or drain electrode 208a and the source or drain electrode 208b to be formed later is improved and disconnection can be prevented.

After that, heat treatment (first heat treatment) is preferably performed on the oxide semiconductor layer 206a. Through the first heat treatment, excessive oxygen (including water or hydroxyl) in the oxide semiconductor layer 206a is removed, a structure of the oxide semiconductor layer 206a is improved, and a defect level in an energy gap can be reduced. The temperature of the first heat treatment is set to higher than or equal to 300° C. and lower than 550° C., or higher than or equal to 400° C. and lower than or equal to 500° C. Note that as described here, in the case where the heat treatment (the first heat treatment) is performed after the etching, the etching can be performed with a high etching rate even when wet etching is employed; therefore, there is an advantage that the time required for the etching can be shortened.

For example, after the substrate 200 is introduced into an electric furnace including a resistance heater or the like, the heat treatment can be performed at 450° C. for 1 hour in a nitrogen atmosphere. The oxide semiconductor layer 206a is not exposed to air during the heat treatment so that entry of water or hydrogen can be prevented.

The heat treatment apparatus is not necessarily limited to the electric furnace and can be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, for example, nitrogen or a rare gas such as argon is used.

For example, as the first heat treatment, GRTA may be performed as follows. The substrate is placed in an inert gas atmosphere which has been heated, heated for several minutes, and taken out of the heated inert gas atmosphere. GRTA enables high-temperature heat treatment for a short time. In addition, such heat treatment is applicable even when a temperature exceeds the upper temperature limit of the substrate because it takes only short time. Note that the inert gas may be changed to a gas containing oxygen during the process. This is because a defect level in an energy gap due to oxygen deficiency can be reduced by the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

In any case, the impurities are reduced by the first heat treatment, so that the oxide semiconductor layer 206a which is an i-type semiconductor layer (an intrinsic semiconductor layer) or a substantially i-type semiconductor layer is formed. Thus, a transistor having extremely excellent characteristics can be realized.

Note that the first heat treatment may be performed on the oxide semiconductor layer 206 which has not yet been processed into the island-shaped oxide semiconductor layer 206a. In that case, after the first heat treatment, the substrate 200 is taken out of the heating apparatus and a photolithography step is performed.

The above heat treatment (the first heat treatment) can also be referred to as dehydration treatment, dehydrogenation treatment, or the like because it has the effect of removing hydrogen or water. The dehydration treatment or dehydrogenation treatment can also be performed after the oxide semiconductor layer 206a is formed, or after the source electrode and the drain electrode are stacked over the oxide semiconductor layer 206a. Such dehydration treatment or dehydrogenation treatment may be performed more than once.

Next, a conductive layer is formed in contact with the oxide semiconductor layer 206a. Then, the conductive layer is selectively etched to form the source or drain electrode 208a and the source or drain electrode 208b (see FIG. 2B).

The conductive layer can be formed by a PVD method such as a sputtering method or a CVD method such as a plasma CVD method. As a material for the conductive layer, an element selected from aluminum, chromium, copper, tantalum, titanium, molybdenum, or tungsten, an alloy containing any of these elements as its component, or the like can be used. Alternatively, one or more materials selected from manganese, magnesium, zirconium, and beryllium may be used. Further alternatively, aluminum combined with one or more elements selected from titanium, tantalum, tungsten, molybdenum, chromium, neodymium, and scandium may be used.

The conductive layer may have either a single-layer structure or a stacked-layer structure of two or more layers. For example, a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, and the like can be given. Note that in the case where the conductive layer has a single-layer structure of a titanium film or a titanium nitride film, there is an advantage that the conductive layer can be easily processed into the source or drain electrode 208a and the source or drain electrode 208b each having a tapered shape.

The conductive layer may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that end portions of the source or drain electrode 208a and the source or drain electrode 208b to be formed have a tapered shape. Here, the tapered angle is preferably greater than or equal to 30° and less than or equal to 60°, for example. The etching is performed so that the end portions of the source or drain electrode 208a and the source or drain electrode 208b have a tapered shape, whereby coverage with the gate insulating layer 212 to be formed later is improved and disconnection can be prevented.

The channel length (L) of the transistor is determined by a distance between a lower edge portion of the source or drain electrode 208a and a lower edge portion of the source or drain electrode 208b. Note that for light exposure in the case where the channel length (L) is less than 25 nm, light exposure for forming a mask is preferably performed with extreme ultraviolet light whose wavelength is several nanometers to several tens of nanometers, which is short. Light exposure with extreme ultraviolet leads to a high resolution and a large depth of focus. Therefore, the channel length (L) of the transistor to be formed later can be greater than or equal to 10 nm and less than or equal to 1000 nm (1 μm), for example greater than or equal to 10 nm and less than or equal to 70 nm, and thus the operation speed of the circuit can be increased. In addition, power consumption of the semiconductor device can be reduced due to miniaturization.

Note that an insulating layer may be formed over the source or drain electrode 208a and the source or drain electrode 208b. When the insulating layer is provided, parasitic capacitance between the gate electrode to be formed later and the source or drain electrode 208a and between the gate electrode and the source or drain electrode 208b can be reduced.

Figure 2C:
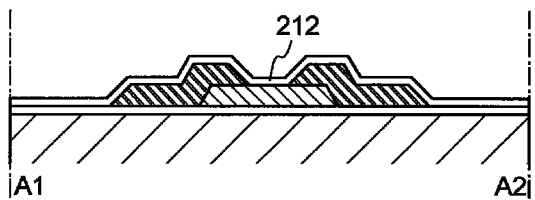

Next, the gate insulating layer 212 is formed in contact with part of the oxide semiconductor layer 206a (see FIG. 2C). The gate insulating layer 212 can be formed by a CVD method, a sputtering method, or the like. The gate insulating layer 212 is preferably formed so as to contain silicon oxide, silicon nitride, silicon oxynitride, aluminum oxide, tantalum oxide, hafnium oxide, yttrium oxide, hafnium silicate (Hf$Si_xO_y$ (x>0, y>0)), hafnium silicate (Hf$Si_xO_y$ (x>0, y>0)) to which nitrogen is added, hafnium aluminate (Hf$Al_xO_y$ (x>0, y>0)) to which nitrogen is added, or the like. The gate insulating layer 212 may have a single-layer structure or a stacked-layer structure. In the case where the semiconductor device is miniaturized, the gate insulating layer 212 is preferably thin in order to ensure the operation of the transistor. For example, in the case where silicon oxide is used, the thickness thereof can be greater than or equal to 0.5 nm and less than or equal to 50 nm, preferably greater than or equal to 0.5 nm and less than or equal to 15 nm, more preferably greater than or equal to 0.5 nm and less than or equal to 3 nm.

When the gate insulating film is formed thin as described above, gate leakage due to a tunnel effect or the like becomes a problem. In order to solve a problem of gate leakage, the gate insulating layer 212 is preferably formed using a material with a high dielectric constant (a high-k material) such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$, (x>0, y>0)) to which nitrogen is added. With the use of a material with a high dielectric constant (a high-k material) for the gate insulating layer 212, the thickness of the gate insulating layer 212 can be large so as to ensure electrical characteristics and prevent gate leakage. Note that the gate insulating layer 212 may have a stacked-layer structure of a film containing a material with a high dielectric constant (a high-k material) and a film containing silicon oxide, silicon nitride, silicon oxynitride, silicon nitride oxide, aluminum oxide, or the like.

The thickness of the gate insulating layer 212 may be set to such a thickness as satisfies a relation where $\in_r/d$ is greater than or equal to 0.08 ($nm^{-1}$) and less than or equal to 7.9 ($nm^{-1}$), preferably greater than or equal to 0.26 ($nm^{-1}$) and less than or equal to 7.9 ($nm^{-1}$), more preferably greater than or equal to 1.3 ($nm^{-1}$) and less than or equal to 7.9 ($nm^{-1}$) when the relative permittivity of a material used for the gate insulating layer 212 is $\in_r$ and the thickness of the gate insulating layer 212 is d. Note that the above condition substantially corresponds to a condition where the thickness of the gate insulating layer 212 is greater than or equal to 0.5 nm and less than or equal to 50 nm, preferably greater than or equal to 0.5 nm and less than or equal to 15 nm, more preferably greater than or equal to 0.5 nm and less than or equal to 3 nm in the case where silicon oxide (the relative permittivity is assumed to be about 3.9) is used.

After the gate insulating layer 212 is formed, second heat treatment is preferably performed in an inert gas atmosphere or an oxygen atmosphere. The temperature of the second heat treatment is higher than or equal to 200° C. and lower than or equal to 450° C., preferably higher than or equal to 250° C. and lower than or equal to 350° C. For example, the second heat treatment may be performed at 250° C. for 1 hour in a nitrogen atmosphere. The second heat treatment can reduce variation in electrical characteristics of the transistor. In the case where the gate insulating layer 212 contains oxygen, it is possible to supply oxygen to the oxide semiconductor layer 206a and compensate for oxygen deficiency in the oxide semiconductor layer 206a so that the oxide semiconductor layer 206a which is an i-type oxide semiconductor layer (an intrinsic semiconductor layer) or a substantially i-type semiconductor layer can be formed.

Although the second heat treatment is performed after the gate insulating layer 212 is formed in this embodiment, the timing of the second heat treatment is not particularly limited thereto. For example, the second heat treatment may be performed after the gate electrode 214 is formed.

Figure 2D:
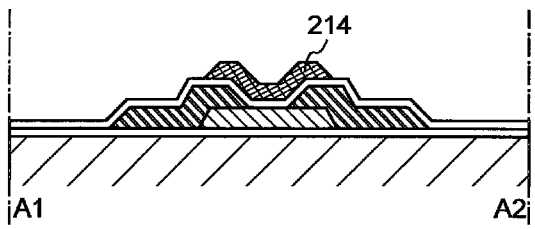

Next, the gate electrode 214 is formed over the gate insulating layer 212 in a region overlapping with the oxide semiconductor layer 206a (see FIG. 2D). The gate electrode 214 can be formed in such a manner that a conductive layer is formed over the gate insulating layer 212 and then patterned selectively. The conductive layer to be the gate electrode 214 can be formed by a PVD method such as a sputtering method or a CVD method such as a plasma CVD method. The details are similar to those for forming the source or drain electrode 208a, the source or drain electrode 208b, and the like, and the description thereof can be referred to.

Figure 2E:
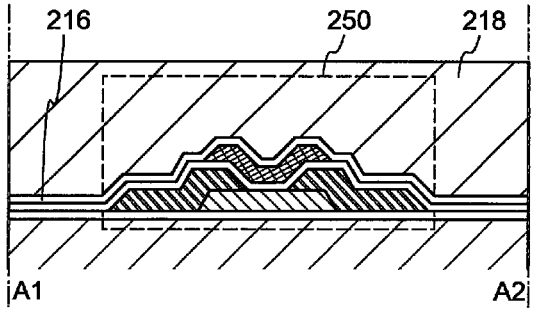

Next, the interlayer insulating layer 216 and the interlayer insulating layer 218 are formed over the gate insulating layer 212 and the gate electrode 214 (see FIG. 2E). The interlayer insulating layers 216 and 218 can be formed by a PVD method, a CVD method, or the like. The interlayer insulating layers 216 and 218 can be formed using a material containing an inorganic insulating material such as silicon oxide, silicon oxynitride, silicon nitride, hafnium oxide, aluminum oxide, or tantalum oxide. Note that the interlayer insulating layers 216 and 218 are stacked in this embodiment, but one embodiment of the disclosed invention is not limited to this example. A single-layer structure or a stacked-layer structure of three or more layers can also be used. Alternatively, the interlayer insulating layer may be omitted.

Note that the interlayer insulating layer 218 is desirably formed so as to have a planarized surface. This is because an electrode, a wiring, or the like can be favorably formed over the interlayer insulating layer 218 even in the case where the semiconductor device is miniaturized, for example. The interlayer insulating layer 218 can be planarized using a method such as chemical mechanical polishing (CMP).

Through the above steps, the transistor 250 including the highly-purified oxide semiconductor layer 206a is completed (see FIG. 2E).

The transistor 250 illustrated in FIG. 2E includes the oxide semiconductor layer 206a provided over the substrate 200 with the insulating layer 202 therebetween; the source or drain electrode 208a and the source or drain electrode 208b electrically connected to the oxide semiconductor layer 206a; the gate insulating layer 212 provided so as to cover the oxide semiconductor layer 206a, the source or drain electrode 208a, and the source or drain electrode 208b; the gate electrode 214 over the gate insulating layer 212; the interlayer insulating layer 216 over the gate insulating layer 212 and the gate electrode 214; and the interlayer insulating layer 218 over the interlayer insulating layer 216.

In the transistor 250 described in this embodiment, the oxide semiconductor layer 206a is highly purified, and the hydrogen concentration in the oxide semiconductor layer 206a is $5×10^{19}$ atoms/$cm^3$ or less, preferably $5×10^{18}$ atoms/$cm^3$ or less, more preferably $5×10^{17}$ atoms/$cm^3$ or less. The oxide semiconductor layer 206a preferably has a sufficiently low carrier density (e.g., less than $1×10^{12}$/$cm^3$, more preferably less than $1.45×10^{10}$/$cm^3$) as compared to a general silicon wafer having a carrier density of approximately $1×10^{14}$/$cm^3$. Thus, off current is sufficiently reduced. For example, the off current density (a value obtained in such a manner that the off current is divided by the channel width of the transistor) of the transistor 250 at room temperature is about $1×10^{-20}$ A/μm (10 zA/μm) to $1×10^{-19}$ A/μm (100 zA/μm).

With the use of the highly-purified and intrinsic oxide semiconductor layer 206a, the off current of the transistor can be sufficiently reduced.

As described in this embodiment, the thicknesses of the oxide semiconductor layer and the gate insulating layer, the distance between the source electrode and the drain electrode, and the like are in their respective predetermined ranges, whereby favorable characteristics can be maintained and miniaturization can be achieved.

The structures, methods, and the like described in this embodiment can be combined with any of the structures, methods, and the like described in the other embodiments as appropriate.

Embodiment 3

In this embodiment, a method for manufacturing a semiconductor device including an oxide semiconductor will be described with reference to FIGS. 3A to 3E. In this embodiment, a method for manufacturing a semiconductor device in which a first oxide semiconductor layer having a crystal region and a second oxide semiconductor layer which is formed by crystal growth from the crystal region of the first oxide semiconductor layer are used as an oxide semiconductor layer, that is, a method for manufacturing the semiconductor device illustrated in FIG. 1B will be described in detail. In the case where a required thickness can be ensured by only the first oxide semiconductor layer, the second oxide semiconductor layer is unnecessary. Note that although a top-gate transistor is described as an example, the structure of a transistor is not limited to a top-gate structure.

First, the insulating layer 302 is formed over the substrate 300. Then, a first oxide semiconductor layer is formed over the insulating layer 302, and first heat treatment is performed to crystallize a region including at least a surface of the first oxide semiconductor layer, whereby a first oxide semiconductor layer 304 is formed (see FIG. 3A).

Note that a substrate similar to the substrate 200 in the above embodiment can be used as the substrate 300. The aforementioned embodiment may be referred to for a detailed description thereof.

The insulating layer 302 serves as a base, and can be formed in a manner similar to that of the insulating layer 202 described in the above embodiment. The aforementioned embodiment may be referred to for a detailed description thereof. Note that it is desirable to form the insulating layer 302 so as to contain hydrogen or water as little as possible. A structure in which the insulating layer 302 is not provided may also be employed.

The first oxide semiconductor layer can be formed in a manner similar to that of the oxide semiconductor layer 206 described in the above embodiment. The aforementioned embodiment may be referred to for the details of the first oxide semiconductor layer and the formation method thereof. Note that since the first oxide semiconductor layer is intentionally crystallized by the first heat treatment in this embodiment, the first oxide semiconductor layer is preferably formed using an oxide semiconductor which is easily crystallized. As such an oxide semiconductor, ZnO can be given, for example. Even in the case of an In—Ga—Zn—O-based oxide semiconductor, for example, the one having a high Zn concentration is easily crystallized; the one in which the proportion of Zn among metal elements (In, Ga, and Zn) is 60 atoms % or more is desirable for this purpose. The thickness of the first oxide semiconductor layer is preferably greater than or equal to 1 nm and less than or equal to 10 nm. In this embodiment, the first oxide semiconductor layer has a thickness of 3 nm as an example. Note that the appropriate thickness varies depending on the material for the oxide semiconductor, the usage of the semiconductor device, or the like, and thus the thickness can be selected as appropriate depending on the material, the usage, or the like.

The temperature of the first heat treatment is higher than or equal to 550° C. and lower than or equal to 850° C., preferably higher than or equal to 600° C. and lower than or equal to 750° C. The time for the heat treatment is preferably longer than or equal to 1 minute and shorter than or equal to 24 hours. Note that the temperature of the heat treatment and the time for the heat treatment vary depending on the kind of oxide semiconductor or the like.

It is preferable that the atmosphere in which the first heat treatment is performed do not contain hydrogen, water, or the like. For example, a nitrogen atmosphere, an oxygen atmosphere, or a rare gas (such as helium, neon, or argon) atmosphere from which water is sufficiently removed can be employed.

The heat treatment apparatus is not necessarily limited to an electric furnace and can be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, for example, nitrogen or a rare gas such as argon is used.

Through the above first heat treatment, the region including at least the surface of the first oxide semiconductor layer is crystallized. The crystal region is formed by crystal growth from the surface of the first oxide semiconductor layer toward the inside of the first oxide semiconductor layer. Note that the crystal region includes a plate-like crystal with an average thickness of greater than or equal to 1 nm and less than or equal to 10 nm in some cases. Further, the crystal region has an a-b plane which is substantially parallel to the surface of the oxide semiconductor layer, and includes a crystal which is c-axis-aligned in a direction substantially perpendicular to the surface in some cases. Here, a "substantially parallel direction" means a direction within ±10° from a parallel direction, and a "substantially perpendicular direction" means a direction within ±10° from a perpendicular direction.

Through the first heat treatment, the crystal region is formed, and in addition, hydrogen (including water and hydroxyl) in the first oxide semiconductor layer is desirably removed. In the case where hydrogen or the like is removed, the first heat treatment is preferably performed in a nitrogen atmosphere, an oxygen atmosphere, or a rare gas (such as helium, neon, or argon) atmosphere having a purity of 6N (99.9999%) or more (that is, the impurity concentration is 1 ppm or less). An atmosphere having a purity of 7N (99.99999%) or more (that is, the impurity concentration is 0.1 ppm or less) is more preferable. The first heat treatment may be performed in an ultra-dry air with an $H_2O$ concentration of 20 ppm or less, preferably in an ultra-dry air with an $H_2O$ concentration of 1 ppm or less.

Through the first heat treatment, the crystal region is formed, and in addition, oxygen is desirably supplied to the first oxide semiconductor layer. For example, the atmosphere in which the heat treatment is performed is set to an oxygen atmosphere, whereby oxygen can be supplied to the first oxide semiconductor layer.

In this embodiment, as the first heat treatment, heat treatment is performed at 700° C. for 1 hour in a nitrogen atmosphere so that hydrogen or the like is removed from the oxide semiconductor layer, and then, the nitrogen atmosphere is changed to an oxygen atmosphere; thus, oxygen is supplied to the first oxide semiconductor layer. Note that the first heat treatment is performed mainly for forming the crystal region, so treatment for removing hydrogen or treatment for supplying oxygen can also be separately performed. For example, it is possible to perform heat treatment for crystallization after heat treatment for removing hydrogen or treatment for supplying oxygen is performed.

Through such first heat treatment, the first oxide semiconductor layer 304 which includes the crystal region, from which hydrogen (including water and hydroxyl) or the like is removed, and to which oxygen is supplied is obtained.

Figure 3A:
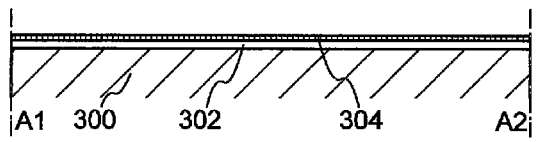
FIGS. 3A to 3E are cross-sectional views illustrating manufacturing steps of a semiconductor device.
Figure 3B:
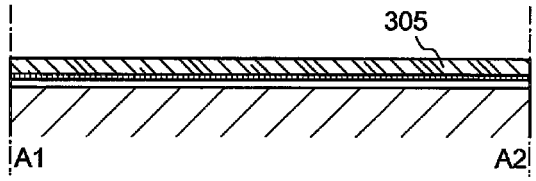

Next, a second oxide semiconductor layer 305 is formed over the first oxide semiconductor layer 304 which includes the crystal region in the region including at least the surface (see FIG. 3B). In the case where a required thickness can be ensured by only the first oxide semiconductor layer 304, the second oxide semiconductor layer 305 is unnecessary. In this case, steps for the second oxide semiconductor layer 305 can be omitted.

The second oxide semiconductor layer 305 can be formed in a manner similar to that of the oxide semiconductor layer 206 described in the above embodiment. The aforementioned embodiment may be referred to for the details of the second oxide semiconductor layer 305 and the formation method thereof. Note that the thickness of the second oxide semiconductor layer 305 is preferably larger than that of the first oxide semiconductor layer 304. The second oxide semiconductor layer 305 is preferably formed so that the sum of the thicknesses of the first oxide semiconductor layer 304 and the second oxide semiconductor layer 305 may be greater than or equal to 1 nm and less than or equal to 50 nm, preferably greater than or equal to 1 nm and less than or equal to 10 nm. In this embodiment, the second oxide semiconductor layer 305 has a thickness of 7 nm as an example. Note that the appropriate thickness varies depending on the material for the oxide semiconductor, the usage of the semiconductor device, or the like, and thus the thickness can be selected as appropriate depending on the material, the usage, or the like.

The second oxide semiconductor layer 305 is preferably formed using a material which contains the same main component as the first oxide semiconductor layer 304 and whose lattice constant after crystallization is close to that of the first oxide semiconductor layer 304 (mismatch is 1% or less). This is because crystal growth using the crystal region of the first oxide semiconductor layer 304 as a seed crystal easily proceeds in crystallization of the second oxide semiconductor layer 305. Further, in the case where the material containing the same main component as the first oxide semiconductor layer 304 is used, favorable interface characteristics or favorable electrical characteristics can be obtained.

Note that in the case where a desired film quality is obtained by the crystallization, the second oxide semiconductor layer 305 may be formed using a material whose main component is different from that of the first oxide semiconductor layer 304.

Next, second heat treatment is performed on the second oxide semiconductor layer 305 so that crystal growth using the crystal region of the first oxide semiconductor layer 304 as a seed proceeds. Thus, a second oxide semiconductor layer 306 is formed (see FIG. 3C). In the case where the second oxide semiconductor layer 305 is not formed, this structure can be omitted.

The temperature of the second heat treatment is higher than or equal to 550° C. and lower than or equal to 850° C., preferably higher than or equal to 600° C. and lower than or equal to 750° C. The time for the second heat treatment is longer than or equal to 1 minute and shorter than or equal to 100 hours, preferably longer than or equal to 5 hours and shorter than or equal to 20 hours, and typically 10 hours.

Note that it is preferable that the atmosphere in which the second heat treatment is performed do not contain hydrogen, water, and the like.

The details of the atmosphere and the effect of the heat treatment are the same as those of the first heat treatment. The heat treatment apparatus that can be used is also the same as that in the case of the first heat treatment. For example, in the second heat treatment, the inside of a furnace is set to a nitrogen atmosphere when the temperature is increased, whereas the inside of the furnace is set to an oxygen atmosphere when cooling is performed; thus, hydrogen or the like can be removed in the case where a nitrogen atmosphere is employed, and oxygen can be supplied in the case where an oxygen atmosphere is employed.

The second heat treatment is performed in the above manner, whereby crystal growth proceeds to the entire portion of the second oxide semiconductor layer 305 from the crystal region formed in the first oxide semiconductor layer 304; thus, the second oxide semiconductor layer 306 can be formed. The second oxide semiconductor layer 306 from which hydrogen (including water and hydroxyl) or the like is removed and to which oxygen is supplied can be formed. In addition, through the second heat treatment, it is also possible to improve orientation of the crystal region of the first oxide semiconductor layer 304.

For example, in the case where an In—Ga—Zn—O-based oxide semiconductor material is used for the second oxide semiconductor layer 306, the second oxide semiconductor layer 306 can include a crystal represented by $InGaO_3(ZnO)_m$ (m: an integer), a crystal represented by $In_2Ga_2ZnO_7$ (In:Ga:Zn:O=2:2:1:7), or the like. Owing to the second heat treatment, the c-axis of such a crystal is aligned in a direction substantially perpendicular to a surface of the second oxide semiconductor layer 306.

Here, the above-described crystal includes any of In, Ga, and Zn, and can be considered to have a stacked-layer structure of layers parallel to a-axis and b-axis. Specifically, the above-described crystal has a structure in which a layer containing In and a layer not containing In (a layer containing Ga or Zn) are stacked in a c-axis direction.

In the In—Ga—Zn—O-based oxide semiconductor crystal, the conductivity of the layer containing In in a plane direction, that is, a direction parallel to a-axis and b-axis is favorable. This is due to the fact that electrical conductivity is mainly controlled by In in the In—Ga—Zn—O-based oxide semiconductor crystal; the fact that the 5 s orbital of one In atom overlaps with the 5 s orbital of an adjacent In atom, so that a carrier path is formed; and the like.

In the case where the first oxide semiconductor layer 304 includes an amorphous region at the interface with the insulating layer 302, the second heat treatment may promote crystal growth from the crystal region formed on the surface of the first oxide semiconductor layer 304 toward the bottom surface of the first oxide semiconductor layer and may crystallize the amorphous region in some cases. Note that depending on the material for forming the insulating layer 302 or heat treatment conditions, the amorphous region may remain.

Figure 3C:
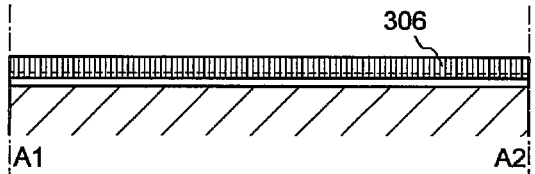

In the case where the first oxide semiconductor layer 304 and the second oxide semiconductor layer 305 are formed using oxide semiconductor materials containing the same main component, the first oxide semiconductor layer 304 and the second oxide semiconductor layer 306 have the same crystal structure as illustrated in FIG. 3C in some cases. Therefore, although the boundary between the first oxide semiconductor layer 304 and the second oxide semiconductor layer 306 is indicated by a dotted line in FIG. 3C, it sometimes cannot be identified, and the first oxide semiconductor layer 304 and the second oxide semiconductor layer 306 can be sometimes regarded as one layer.

Figure 3D:
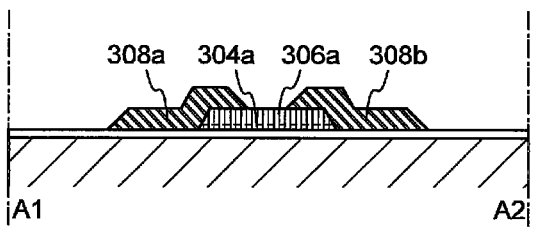

Next, the first oxide semiconductor layer 304 and the second oxide semiconductor layer 306 are processed by a method such as etching using a mask; thus, the island-shaped first oxide semiconductor layer 304a and the island-shaped second oxide semiconductor layer 306a are formed (see FIG. 3D). Note that here, the oxide semiconductor layers are processed into the island-shaped oxide semiconductor layers after the second heat treatment; however, the oxide semiconductor layers may be processed into the island-shaped oxide semiconductor layers before the second heat treatment. In this case, the etching can be performed with a high etching rate even in the case when wet etching is employed; thus, there is an advantage that the time required for the etching can be shortened.

As a method for etching the first oxide semiconductor layer 304 and the second oxide semiconductor layer 306, either dry etching or wet etching may be employed. It is needless to say that dry etching and wet etching can be used in combination. The etching conditions (e.g., an etching gas, an etchant, etching time, and temperature) are set as appropriate depending on the material so that the oxide semiconductor layers can be etched into desired shapes. The first oxide semiconductor layer 304 and the second oxide semiconductor layer 306 can be etched in a manner similar to that of the oxide semiconductor layer described in the above embodiment. The aforementioned embodiment may be referred to for a detailed description thereof.

Note that a region serving as a channel formation region in the oxide semiconductor layer preferably has a planarized surface. For example, the peak-to-valley distance (P-V) of the surface of the second oxide semiconductor layer 306 is preferably 1 nm or less (preferably 0.5 nm or less) in a region overlapping with the gate electrode 314 (the channel formation region). Note that for the above peak-to-valley distance, for example, a value obtained by the measurement performed on a region of 10 μm×10 μm can be used.

Next, a conductive layer is formed in contact with the second oxide semiconductor layer 306a. Next, the conductive layer is selectively etched to form the source or drain electrode 308a and the source or drain electrode 308b (see FIG. 3D). The source or drain electrode 308a and the source or drain electrode 308b can be formed in a manner similar to that of the source or drain electrode 208a and the source or drain electrode 208b described in the above embodiment. The aforementioned embodiment may be referred to for a detailed description thereof.

Note that in the step of FIG. 3D, a crystal layer in contact with the source or drain electrode 308a or the source or drain electrode 308b is in an amorphous state in the first oxide semiconductor layer 304a or the second oxide semiconductor layer 306a in some cases. Therefore, the entire region of the first oxide semiconductor layer 304a and the second oxide semiconductor layer 306a does not necessarily have a crystal structure.

Next, the gate insulating layer 312 is formed in contact with part of the second oxide semiconductor layer 306a. The gate insulating layer 312 can be formed in a manner similar to that of the gate insulating layer 212 in the above embodiment. The aforementioned embodiment may be referred to for a detailed description thereof. After that, the gate electrode 314 is formed in a region overlapping with the first oxide semiconductor layer 304a and the second oxide semiconductor layer 306a over the gate insulating layer 312. Then, the interlayer insulating layer 316 and the interlayer insulating layer 318 are formed over the gate insulating layer 312 and the gate electrode 314 (see FIG. 3E). The gate electrode 314, the interlayer insulating layer 316, and the interlayer insulating layer 318 can be formed in a manner similar to that of the gate electrode 214, the interlayer insulating layer 216, the interlayer insulating layer 218, respectively, described in the above embodiment. The aforementioned embodiment may be referred to for a detailed description thereof.

After the gate insulating layer 312 is formed, third heat treatment is desirably performed in an inert gas atmosphere or an oxygen atmosphere. The temperature of the third heat treatment is higher than or equal to 200° C. and lower than or equal to 450° C., preferably higher than or equal to 250° C. and lower than or equal to 350° C. For example, the third heat treatment may be performed at 250° C. for 1 hour in an atmosphere containing oxygen. The third heat treatment can reduce variation in electrical characteristics of the transistor. In the case where the gate insulating layer 312 is an insulating layer containing oxygen, oxygen can be supplied to the second oxide semiconductor layer 306a.

Note that although the third heat treatment is performed after the formation of the gate insulating layer 312 in this embodiment, the timing of the third heat treatment is not limited thereto. In the case where oxygen is supplied to the second oxide semiconductor layer 306a by another treatment such as the second heat treatment, the third heat treatment may be omitted.

Figure 3E:
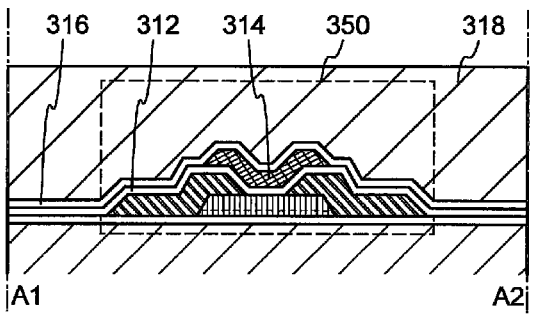

Through the above steps, the transistor 350 including the first oxide semiconductor layer 304a and the second oxide semiconductor layer 306a is completed (see FIG. 3E).

The transistor 350 illustrated in FIG. 3E includes the first oxide semiconductor layer 304a provided over the substrate 300 with the insulating layer 302 therebetween; the second oxide semiconductor layer 306a provided over the first oxide semiconductor layer 304a; the source or drain electrode 308a and the source or drain electrode 308b electrically connected to the second oxide semiconductor layer 306a; the gate insulating layer 312 provided so as to cover the second oxide semiconductor layer 306a, the source or drain electrode 308a, and the source or drain electrode 308b; the gate electrode 314 over the gate insulating layer 312; the interlayer insulating layer 316 over the gate insulating layer 312 and the gate electrode 314; and the interlayer insulating layer 318 over the interlayer insulating layer 316.

In the transistor 350 described in this embodiment, the first oxide semiconductor layer 304a and the second oxide semiconductor layer 306a are highly purified, and the hydrogen concentration in the first oxide semiconductor layer 304a and the second oxide semiconductor layer 306a is $5 \times 10^{19}$ atoms/cm$^3$ or less, preferably $5 \times 10^{18}$ atoms/cm$^3$ or less, more preferably $5 \times 10^{17}$ atoms/cm$^3$ or less. The first oxide semiconductor layer 304a and the second oxide semiconductor layer 306a have a sufficiently low carrier density (e.g., less than $1 \times 10^{12}$/cm$^3$, more preferably less than $1.45 \times 10^{10}$/cm$^3$) as compared to a general silicon wafer having a carrier density of approximately $1 \times 10^{14}$/cm$^3$. Thus, off current is sufficiently reduced. For example, the off current density (a value obtained in such a manner that the off current is divided by the channel width of the transistor) of the transistor 350 at room temperature is about $1 \times 10^{-20}$ A/μm (10 zA/μm) to $1 \times 10^{-19}$ A/μm (100 zA/μm).

With the use of the first oxide semiconductor layer 304a and the second oxide semiconductor layer 306a which are highly purified and become intrinsic oxide semiconductors, the off current of the transistor can be sufficiently reduced.

Further, in this embodiment, the first oxide semiconductor layer 304a including the crystal region and the second oxide semiconductor layer 306a which is formed by crystal growth from the crystal region of the first oxide semiconductor layer 304a are used as the oxide semiconductor layer; thus, field effect mobility is improved and a transistor having favorable electrical characteristics can be realized. For example, the field effect mobility μ can be higher than 100 cm$^2$/V·sec.

As described in this embodiment, the thicknesses of the oxide semiconductor layer and the gate insulating layer, the distance between the source electrode and the drain electrode, and the like are in their respective predetermined ranges, whereby favorable characteristics can be maintained and miniaturization can be achieved.

The structures, methods, and the like described in this embodiment can be combined with any of the structures, methods, and the like described in the other embodiments as appropriate.

Embodiment 4

In this embodiment, a method for manufacturing a semiconductor device including an oxide semiconductor will be described. Specifically, a method for manufacturing the semiconductor device in FIG. 1C will be described with reference to FIGS. 4A to 4E. Note that a method for manufacturing a semiconductor device according to this embodiment has a lot in common with the method for manufacturing a semiconductor device described in any of the above embodiments (in particular, Embodiment 2). Therefore, different points will be mainly described. Note that it is possible to manufacture the semiconductor device shown in FIG. 1D by combination of a manufacturing method of this embodiment and part of any of the above embodiments (e.g., Embodiment 3).

First, the insulating layer 402 is formed over the substrate 400. After that, an oxide semiconductor layer 406 is formed over the insulating layer 402 (see FIG. 4A). The aforementioned embodiment may be referred to for a detailed description thereof.

Next, the oxide semiconductor layer 406 is processed by a method such as etching using a mask to form the island-shaped oxide semiconductor layer 406a. A conductive layer 408 and an insulating layer 410 are formed so as to cover the oxide semiconductor layer 406a (see FIG. 4B). Note that the insulating layer 410 is not an essential component but is effective in selectively oxidizing side surfaces of the source electrode and the drain electrode to be formed later. In addition, the insulating layer 410 is effective also in reducing capacitance between the gate electrode and the source or drain electrode.

The aforementioned embodiment can be referred to for a detailed description of the formation of the island-shaped oxide semiconductor layer 406a and heat treatment. In addition, the aforementioned embodiment can be referred to for a detailed description of the conductive layer 408.

The insulating layer 410 can be formed by a CVD method, a sputtering method, or the like. The insulating layer 410 is preferably formed so as to contain silicon oxide, silicon nitride, silicon oxynitride, aluminum oxide, hafnium oxide, tantalum oxide, or the like. Note that the insulating layer 410 may have a single-layer structure or a stacked-layer structure. There is no particular limitation on the thickness of the insulating layer 410; the insulating layer 410 can have a thickness of greater than or equal to 10 nm and less than or equal to 200 nm, for example.

Figure 4A:
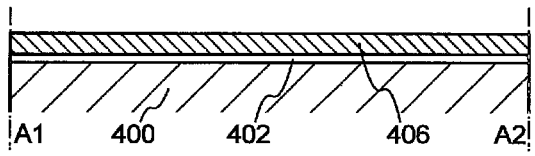
FIGS. 4A to 4E are cross-sectional views illustrating manufacturing steps of a semiconductor device.
Figure 4B:
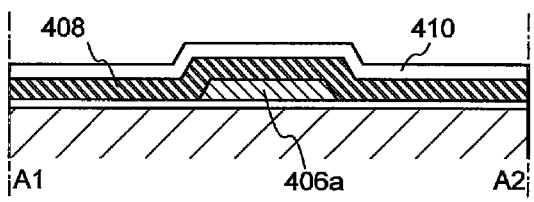
Figure 4C:
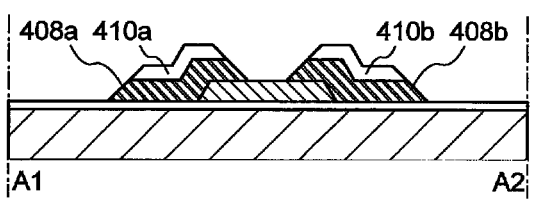
Figure 4D:
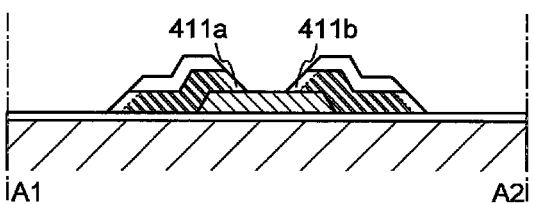
Figure 4E:
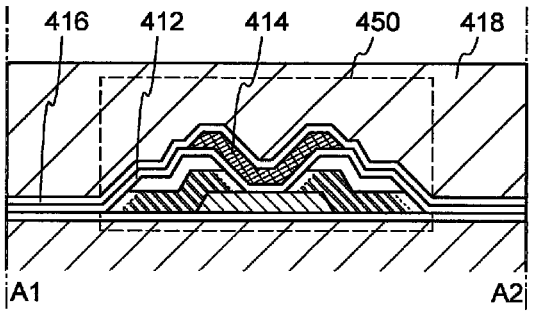

Next, the conductive layer 408 and the insulating layer 410 are selectively etched; thus, the source or drain electrode 408a, the source or drain electrode 408b, the insulating layer 410a, and the insulating layer 410b are formed (see FIG. 4C). The details are similar to those of the process of forming the source and drain electrodes in the above embodiment. Note that a material such as aluminum, titanium, molybdenum, or copper is suitable for plasma oxidation treatment which is to be performed later, and is preferably used as a material for the source or drain electrode 408a and the source or drain electrode 408b.

Then, oxidation treatment is performed in order to supply oxygen to the oxide semiconductor layer 406a. By the oxidation treatment, the oxide region 411a is formed in part of the source or drain electrode 408a, and the oxide region 411b is formed in part of the source or drain electrode 408b (see FIG. 4D). By the oxidation treatment, an oxide region is formed also on the periphery of the source or drain electrode 408a and the source or drain electrode 408b.

The oxidation treatment is preferably performed using oxygen plasma excited with a microwave (300 MHz to 300 GHz), which may be referred to as plasma oxidation treatment. The reason is that high-density plasma is realized by plasma excitation with a microwave and damage to the oxide semiconductor layer 406a can be sufficiently reduced.

Specifically, the above treatment can be performed, for example, at a frequency of 300 MHz to 300 GHz (typically, 2.45 GHz) under a pressure of 50 Pa to 5000 Pa (typically, 500 Pa) at a substrate temperature of 200° C. to 400° C. (typically, 300° C.) with the use of a mixed gas of oxygen and argon.

By the above oxidation treatment, oxygen is supplied to the oxide semiconductor layer 406a. Therefore, damage to the oxide semiconductor layer 406a can be sufficiently reduced, and in addition, a defect level in an energy gap due to oxygen deficiency can be reduced. In other words, characteristics of the oxide semiconductor layer 406a can be further improved.

Note that without limitation to the plasma oxidation treatment with a microwave, any other method that enables a sufficient reduction in damage to the oxide semiconductor layer 406a and a supply of oxygen to the oxide semiconductor layer 406a can be used. For example, a method such as heat treatment in an atmosphere containing oxygen can be used.

In combination with the oxidation treatment, treatment for removing water, hydrogen, or the like from the oxide semiconductor layer 406a may be performed. In this case, for example, plasma treatment using a gas such as nitrogen or argon can be performed.

Note that by the oxidation treatment, the oxide region 411a and the oxide region 411b are respectively formed in part of the source or drain electrode 408a and part of the source or drain electrode 408b (particularly, portions corresponding to side surfaces thereof). The oxide regions are effective particularly when the transistor 450 is miniaturized (for example, when the channel length is shorter than 1000 nm, particularly 70 nm or shorter). With the miniaturization of the transistor, the gate insulating layer 412 needs to have a smaller thickness. The reason why the oxide regions are provided is that the oxide regions can prevent short circuit between the gate electrode 414 and the source or drain electrode 408a and between the gate electrode 414 and the source or drain electrode 408b, which may be caused by a reduction in thickness of the gate insulating layer 412 or defective coverage therewith. Note that the oxide regions are sufficiently effective when having a thickness of 5 nm or more (preferably, 10 nm or more).

The oxidation treatment is also effective in terms of improvement in film quality of an exposed portion of the insulating layer 402.

Note that the insulating layer 410a and the insulating layer 410b are important in that these insulating layers function to prevent oxidation of upper portions of the source or drain electrode 408a and the source or drain electrode 408b. This is because it is significantly difficult to perform the plasma treatment while the mask used for etching remains.

Next, the gate insulating layer 412 is formed in contact with part of the oxide semiconductor layer 406a without exposure to air. Then, the gate electrode 414 is formed over the gate insulating layer 412 in a region overlapping with the oxide semiconductor layer 406a, and the interlayer insulating layer 416 and the interlayer insulating layer 418 are formed over the gate insulating layer 412 and the gate electrode 414 (see FIG. 4E). The aforementioned embodiment can be referred to for a detailed description thereof.

Through the above steps, the transistor 450 including an oxide semiconductor is completed.

In this embodiment, oxygen plasma treatment is performed on the oxide semiconductor layer 406a in order to supply oxygen to the oxide semiconductor layer 406a. Accordingly, the transistor 450 has better characteristics. In addition, a region corresponding to a side surface of the source or drain electrode is oxidized; thus, short circuit between the gate electrode and the source electrode (or the drain electrode), which may be caused by a reduction in thickness of the gate insulating layer, can be prevented.

Further, when the insulating layer is provided over the source and drain electrodes, capacitance formed between the gate electrode and the source electrode and between the gate electrode and the drain electrode can be reduced; thus, the semiconductor device can operate at higher speed.

The structures, methods, and the like described in this embodiment can be combined as appropriate with any of the structures, methods, and the like described in the other embodiments.

Embodiment 5

In this embodiment, an example of a semiconductor device including the transistor which is described in the above embodiment will be described with reference to FIGS. 5A and 5B, FIGS. 6A and 6B, FIGS. 7A1, 7A2, and 7B, and FIGS. 8A and 8B.

<Example of Structure of Semiconductor Device>

Figure 5A:
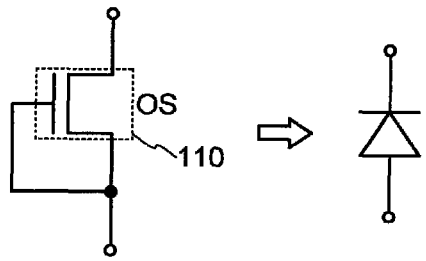
FIGS. 5A and 5B are circuit diagrams of semiconductor devices.

FIG. 5A shows a circuit configuration in the case where the transistor described in the above embodiment is used as a diode. Note that in a diode-connected transistor 110, the side of a gate terminal and a first terminal is an anode and the side of a second terminal is a cathode.

Figure 5B:
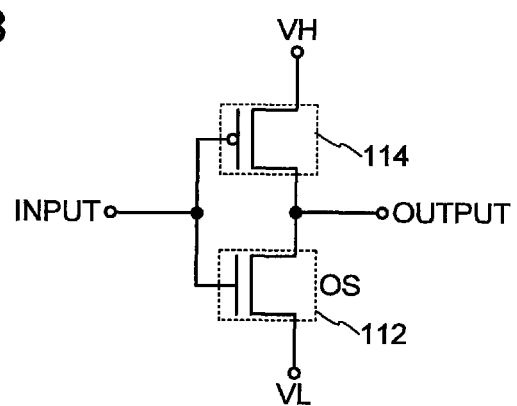

FIG. 5B shows an example of a CMOS circuit in which an n-channel transistor and a p-channel transistor are complementarily combined. Here, a CMOS inverter circuit which is the simplest CMOS circuit is described. In the CMOS inverter circuit, a gate electrode of a first transistor 112 is electrically connected to a gate electrode of a second transistor 114; a source electrode of the first transistor 112 is electrically connected to one terminal VL; a drain electrode of the first transistor 112 is electrically connected to a source electrode of the second transistor 114; and a drain electrode of the second transistor 114 is electrically connected to the other terminal VH.

The first transistor 112 is an n-channel transistor, and the transistor described in the above embodiment can be employed. The second transistor 114 is a p-channel transistor, and the second transistor 114 can be formed using an oxide semiconductor or other materials (e.g., silicon).

Figure 6A:
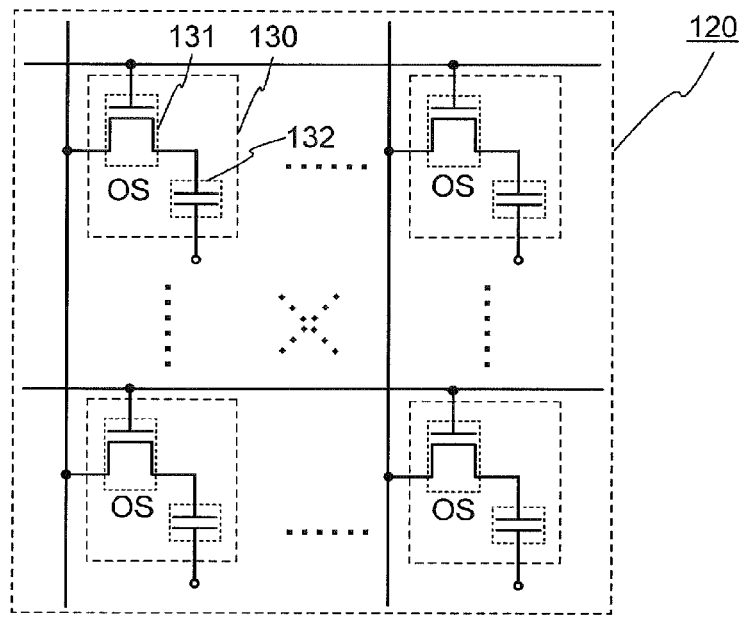
FIGS. 6A and 6B are circuit diagrams of semiconductor devices.

FIG. 6A shows an example of a semiconductor device whose structure corresponds to a so-called DRAM (dynamic random access memory). A memory cell array 120 shown in FIG. 6A has a structure in which a plurality of memory cells 130 are arranged in matrix. The memory cell array 120 includes a plurality of first wirings and a plurality of second wirings.

The memory cell 130 includes a transistor 131 and a capacitor 132. A gate electrode of the transistor 131 is electrically connected to the first wiring. One of a source electrode and a drain electrode of the transistor 131 is electrically connected to the second wiring, and the other of the source electrode and the drain electrode of the transistor 131 is electrically connected to one electrode of the capacitor. The other electrode of the capacitor is supplied with a predetermined potential. The transistor described in any of the above embodiments is applied to the transistor 131.

The transistor described in any of the above embodiments has extremely low off current. Therefore, in the case where the transistor is applied to the semiconductor device described in FIG. 6A which is recognized as a so-called DRAM, a substantially nonvolatile memory can be obtained.

Figure 6B:
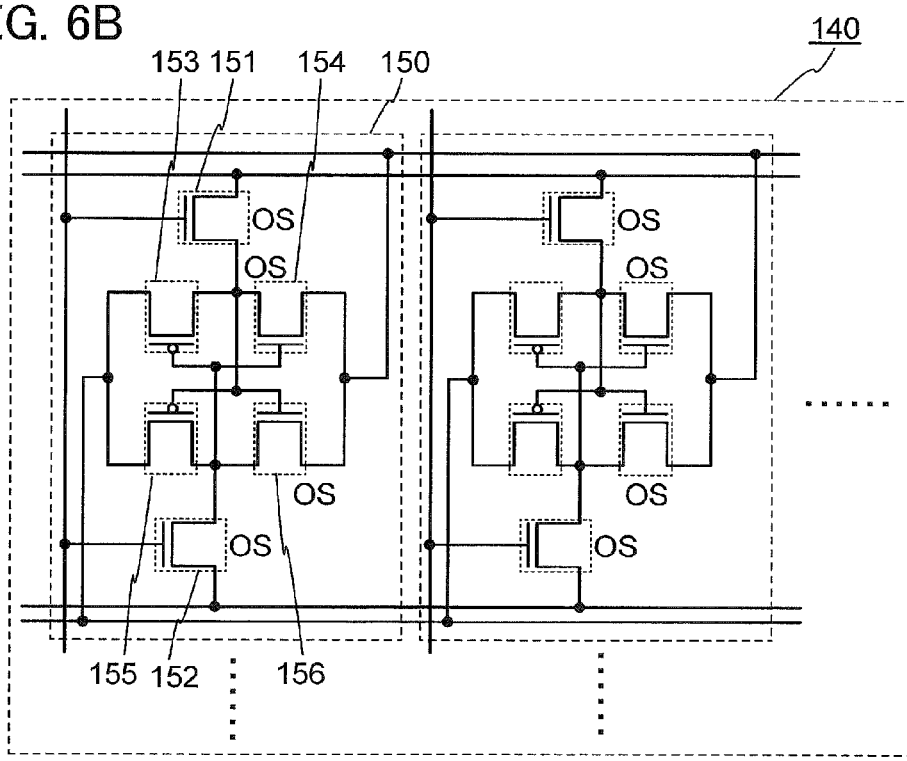

FIG. 6B shows an example of a semiconductor device whose structure corresponds to a so-called SRAM (static random access memory). A memory cell array 140 shown in FIG. 6B has a structure in which a plurality of memory cells 150 are arranged in matrix. The memory cell array 140 includes a plurality of first wirings, a plurality of second wirings, a plurality of third wirings, and a plurality of fourth wirings.

The memory cell 150 includes a first transistor 151, a second transistor 152, a third transistor 153, a fourth transistor 154, a fifth transistor 155, and a sixth transistor 156. The first transistor 151 and the second transistor 152 each function as a selection transistor. One of the third transistor 153 and the fourth transistor 154 is an n-channel transistor (here, the fourth transistor 154 is an n-channel transistor), and the other of the third transistor 153 and the fourth transistor 154 is a p-channel transistor (here, the third transistor 153 is a p-channel transistor). In other words, the third transistor 153 and the fourth transistor 154 form a CMOS circuit. Similarly, the fifth transistor 155 and the sixth transistor 156 form a CMOS circuit.

The first transistor 151, the second transistor 152, the fourth transistor 154, and the sixth transistor 156 are n-channel transistors, and the transistor described in any of the above embodiments can be applied thereto. The third transistor 153 and the fifth transistor 155 are p-channel transistors, and they can be formed using an oxide semiconductor or other materials (e.g., silicon).

<Example of Structure of Nonvolatile Memory Device>

Next, an example of a structure of a nonvolatile memory device including the transistor according to any of the above embodiments will be described with reference to FIGS. 7A1, 7A2, and 7B and FIGS. 8A and 8B.

In a semiconductor device shown in FIG. 7A1, a first wiring (a 1st line, also referred to as a source line) and a source electrode of a transistor 160 are electrically connected to each other, and a second wiring (a 2nd line, also referred to as a bit line) and a drain electrode of the transistor 160 are electrically connected to each other. A third wiring (a 3rd line, also referred to as a first signal line) and one of a source electrode and a drain electrode of a transistor 162 are electrically connected to each other. A fourth wiring (a 4th line, also referred to as a second signal line) and a gate electrode of the transistor 162 are electrically connected to each other. A gate electrode of the transistor 160 and the other of the source electrode and the drain electrode of the transistor 162 are electrically connected to one electrode of the capacitor 164, and a fifth wiring (a 5th line, also referred to as a word line) and the other electrode of the capacitor 164 are electrically connected to each other.

Here, the transistor including an oxide semiconductor, which is described in any of the above embodiments, is applied to at least the transistor 162. The transistor including an oxide semiconductor, which is described in any of the above embodiments, has extremely low off current. For that reason, a potential of the gate electrode of the transistor 160 can be held for an extremely long time by turning off the transistor 162. The capacitor 164 is provided, which facilitates holding of charge given to the gate electrode of the transistor 160 and reading of stored data. The transistor 162 including an oxide semiconductor has a channel length (L) of greater than or equal to 10 nm and less than or equal to 1000 nm, for example, greater than or equal to 10 nm and less than or equal to 70 nm; thus, it has characteristics of low power consumption and high-speed operation. The transistor 160 may include either an oxide semiconductor or other materials.

The semiconductor device in FIG. 7A1 utilizes an advantage that the potential of the gate electrode of the transistor 160 can be held, whereby writing, holding, and reading of data can be performed as described below.

Description is made on writing and holding of data first. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, a predetermined charge is given to the gate electrode of the transistor 160 (writing). Here, one of charges for supply of two different potentials (hereinafter, referred to as a Low-level charge and a High-level charge) is given to the gate electrode of the transistor 160. After that, the potential of the fourth wiring is set to a potential at which the transistor 162 is turned off, so that the transistor 162 is turned off. Thus, the charge given to the gate electrode of the transistor 160 is held (holding).

Since the off current of the transistor 162 is significantly small, the charge of the gate electrode of the transistor 160 is held for a long time.

Next, description is made on reading of data. By supplying an appropriate potential (reading potential) to the fifth wiring while a predetermined potential (constant potential) is supplied to the first wiring, the potential of the second wiring varies depending on the amount of charge held in the gate electrode of the transistor 160. This is because in general, when the transistor 160 is an n-channel transistor, an apparent threshold voltage $V_{th\_H}$ in the case where a High-level charge is given to the gate electrode of the transistor 160 is lower than an apparent threshold voltage $V_{th\_L}$ in the case where a Low-level charge is given to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby a charge given to the gate electrode of the transistor 160 can be determined. For example, in the case where a High-level charge is given in writing, when the potential of the fifth wiring is set to $V_0$ ($>V_{th\_H}$), the transistor 160 is turned on. In the case where a Low-level charge is given in writing, even when the potential of the fifth wiring is set to $V_0$ ($<V_{th\_L}$), the transistor 160 remains in an off state. Therefore, the stored data can be read by the potential of the second wiring.

In the case where data is not read, a potential which allows the transistor 160 to be turned off regardless of a state of the gate electrode, that is, a potential lower than $V_{th\_H}$ may be applied to the fifth wiring. Alternatively, a potential which allows the transistor 160 to be turned on regardless of a state of the gate electrode, that is, a potential higher than $V_{th\_L}$ may be applied to the fifth wiring.

Then, description is made on rewriting of data. Rewriting of data is performed in a manner similar to that of the writing and holding of data. That is, the potential of the fourth wiring is set to a potential which allows the transistor 162 to be turned on, whereby the transistor 162 is turned on. Accordingly, the potential of the third wiring (potential related to new data) is supplied to the gate electrode of the transistor 160 and the capacitor 164. After that, the potential of the fourth wiring is set to a potential which allows the transistor 162 to be turned off, whereby the transistor 162 is turned off. Accordingly, charge related to new data is given to the gate electrode of the transistor 160.

In the semiconductor device according to the disclosed invention, data can be directly rewritten by another writing of data as described above. For that reason, erasing operation which is necessary for a flash memory or the like is not needed, so that a reduction in operation speed caused by the erasing operation can be prevented. In other words, high-speed operation of the semiconductor device can be realized.

Note that the source electrode or the drain electrode of the transistor 162 is electrically connected to the gate electrode of the transistor 160, thereby having an effect similar to that of a floating gate of a floating gate transistor used for a nonvolatile memory element. Therefore, a portion in the drawing where the source electrode or the drain electrode of the transistor 162 is electrically connected to the gate electrode of the transistor 160 is called a floating gate portion FG in some cases. When the transistor 162 is off, the floating gate portion FG can be regarded as being embedded in an insulator and thus charge is held in the floating gate portion FG. The amount of off current of the transistor 162 including an oxide semiconductor is smaller than or equal to one hundred thousandth of the amount of off current of a transistor including a silicon semiconductor or the like; thus, lost of the charge accumulated in the floating gate portion FG due to leakage current of the transistor 162 is negligible. That is, with the transistor 162 including an oxide semiconductor, a nonvolatile memory device can be realized.

The semiconductor device in FIG. 7A1 can have a circuit structure shown in FIG. 7A2 assuming that the components such as a transistor in the semiconductor device in FIG. 7A1 include a resistor and a capacitor. That is, in FIG. 7A2, the transistor 160 and the capacitor 164 are each regarded as including a resistor and a capacitor. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance value C2 corresponds to the capacitance value of so-called gate capacitance (capacitance formed between the gate electrode and the source electrode or the drain electrode). Note that since the resistance value R2 merely shows the resistance value between the gate electrode of the transistor 160 and the channel formation region thereof, part of connection is shown by a dotted line in order to show this point clearly.

When the resistance value (also referred to as effective resistance) between the source electrode and the drain electrode in the case where the transistor 162 is in an off state is ROS and when ROS is R1 or smaller and ROS is R2 or smaller, a charge holding period (also referred to as a data holding period) is determined mainly by off current of the transistor 162.

On the other hand, when the conditions are not met, it is difficult to sufficiently ensure the holding period even if the off current of the transistor 162 is small enough. This is because leakage caused in a portion other than the transistor 162 is large. Thus, it can be said that the semiconductor device disclosed in this embodiment desirably satisfies the above relation.

It is desirable that C1≥C2 be satisfied. If C1 is large, the potential of the fifth wiring can be kept low when the potential of the floating gate portion FG is controlled by the fifth wiring (e.g., at the time of reading).

When the above relation is satisfied, a more preferable semiconductor device can be realized. Note that R1 and R2 are controlled by the gate insulating layer of the transistor 160 and a gate insulating layer of the transistor 162. The same relation is applied to C1 and C2. Therefore, the material, the thickness, and the like of the gate insulating layer are desirably set as appropriate to satisfy the above relation.

A semiconductor device having a structure different from the above semiconductor device is shown in FIG. 7B. In the semiconductor device shown in FIG. 7B, the gate electrode of the transistor 160, one of the source electrode and the drain electrode of the transistor 162, and one electrode of the capacitor 164 are electrically connected to one another. The first wiring and the source electrode of the transistor 160 are electrically connected to each other. The second wiring and the drain electrode of the transistor 160 are electrically connected to each other. The third wiring and the other of the source electrode and the drain electrode of the transistor 162 are electrically connected to each other. The fourth wiring and a first gate electrode of the transistor 162 are electrically connected to each other. The fifth wiring and the other electrode of the capacitor 164 are electrically connected to each other. A sixth wiring and a second gate electrode of the transistor 162 are electrically connected to each other. A potential the same as that applied to the fourth wiring may be applied to the sixth wiring. Alternatively, a potential different from that applied to the fourth wiring may be applied to the sixth wiring so that the sixth wiring is controlled independently of the fourth wiring.

That is, in the semiconductor device in FIG. 7B, the transistor 162 of the semiconductor device in FIG. 7A1 is replaced with the transistor 162 having the second gate electrode. Thus, the semiconductor device in FIG. 7B can obtain the effect of easily adjusting electrical characteristics of the transistor 162 (e.g., the threshold voltage) in addition to the effects obtained in the semiconductor device in FIG. 7A1. For example, by application of a negative potential to the sixth wiring, the transistor 162 can be easily normally-off.

Note that an n-channel transistor in which electrons are majority carriers is used in the above description; it is needless to say that a p-channel transistor in which holes are majority carriers can be used instead of the n-channel transistor.

Figure 8A:
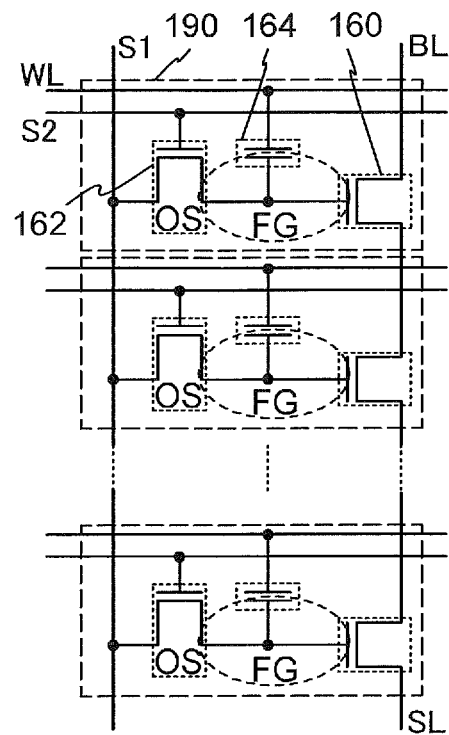
FIGS. 8A and 8B are circuit diagrams of semiconductor devices.
Figure 8B:
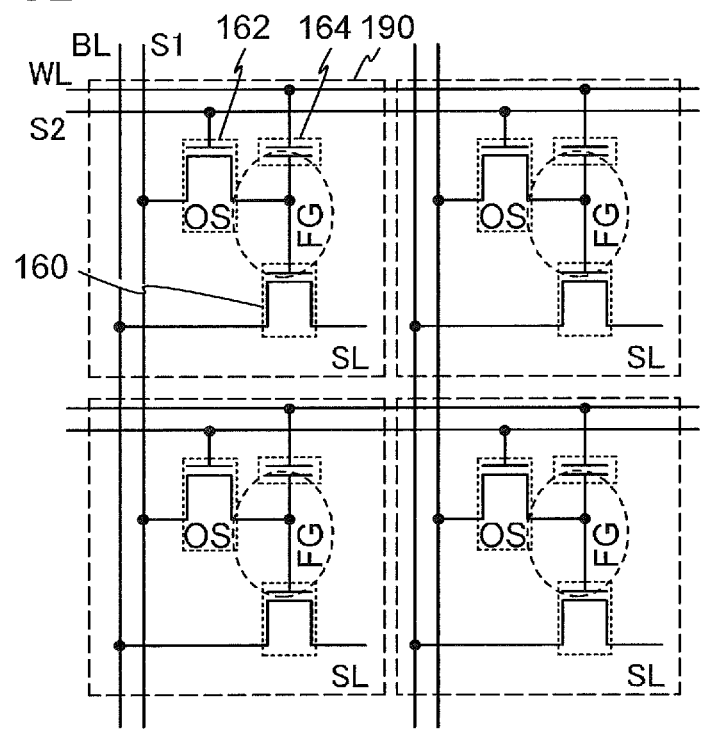

Next, application examples of the semiconductor devices illustrated in FIGS. 7A1, 7A2, and 7B are described with reference to FIGS. 8A and 8B. FIGS. 8A and 8B are examples of circuit diagrams of semiconductor devices each including a plurality of semiconductor devices (hereinafter also referred to as memory cells 190) illustrated in FIG. 7A1. FIG. 8A is a circuit diagram of a so-called NAND semiconductor device in which the memory cells 190 are connected in series, and FIG. 8B is a circuit diagram of a so-called NOR semiconductor device in which the memory cells 190 are connected in parallel.

The semiconductor device in FIG. 8A includes a source line SL, a bit line BL, a first signal line S1, a plurality of second signal lines S2, a plurality of word lines WL, and the plurality of memory cells 190. In FIG. 8A, one source line SL and one bit line BL are provided in the semiconductor device; however, one embodiment of the disclosed invention is not limited to this. A plurality of source lines SL and a plurality of bit lines BL may be provided.

In each of the memory cells 190, the gate electrode of the transistor 160, one of the source electrode and the drain electrode of the transistor 162, and one electrode of the capacitor 164 are electrically connected to one another. The first signal line S1 and the other of the source electrode and the drain electrode of the transistor 162 are electrically connected to each other, and the second signal line S2 and the gate electrode of the transistor 162 are electrically connected to each other. The word line WL and the other electrode of the capacitor 164 are electrically connected to each other.

Further, the source electrode of the transistor 160 included in the memory cell 190 is electrically connected to the drain electrode of the transistor 160 in the adjacent memory cell 190. The drain electrode of the transistor 160 included in the memory cell 190 is electrically connected to the source electrode of the transistor 160 in the adjacent memory cell 190. Note that the drain electrode of the transistor 160 included in the memory cell 190 of the plurality of memory cells connected in series, which is provided at one of ends, is electrically connected to the bit line. The source electrode of the transistor 160 included in the memory cell 190 of the plurality of memory cells connected in series, which is provided at the other end, is electrically connected to the source line.

In the semiconductor device in FIG. 8A, writing operation and reading operation are performed in each row. The writing operation is performed as follows. A potential at which the transistor 162 is turned on is supplied to the second signal line S2 of a row where writing is to be performed, so that the transistor 162 of the row where writing is to be performed is turned on. Accordingly, a potential of the first signal line S1 is supplied to the gate electrode of the transistor 160 of the specified row, so that a predetermined charge is given to the gate electrode. Thus, data can be written to the memory cell of the specified row.

Further, the reading operation is performed as follows. First, a potential at which the transistor 160 is turned on regardless of charge in the gate electrode thereof is supplied to the word lines WL of the rows other than the row where reading is to be performed, so that the transistors 160 of the rows other than the row where reading is to be performed are turned on. Then, a potential (reading potential) at which an on state or an off state of the transistor 160 is determined depending on charge in the gate electrode of the transistor 160 is supplied to the word line WL of the row where reading is to be performed. After that, a constant potential is supplied to the source line SL so that a reading circuit (not illustrated) connected to the bit line BL is operated. Here, the plurality of transistors 160 between the source line SL and the bit line BL are on except the transistors 160 of the row where reading is to be performed; therefore, conductance between the source line SL and the bit line BL is determined by a state of the transistors 160 of the row where reading is to be performed. That is, a potential of the bit line BL, which is read by the reading circuit, depends on charge in the gate electrode of the transistors 160 of the row where reading is to be performed. In such a manner, data can be read from the specified memory cell.

The semiconductor device in FIG. 8B includes a plurality of source lines SL, a plurality of bit lines BL, a plurality of first signal lines S1, a plurality of second signal lines S2, a plurality of word lines WL, and a plurality of the memory cells 190. The gate electrode of the transistor 160, one of the source electrode and the drain electrode of the transistor 162, and one electrode of the capacitor 164 are electrically connected to one another. The source line SL and the source electrode of the transistor 160 are electrically connected to each other. The bit line BL and the drain electrode of the transistor 160 are electrically connected to each other. The first signal line S1 and the other of the source electrode and the drain electrode of the transistor 162 are electrically connected to each other, and the second signal line S2 and the gate electrode of the transistor 162 are electrically connected to each other. The word line WL and the other electrode of the capacitor 164 are electrically connected to each other.

In the semiconductor device in FIG. 8B, writing operation and reading operation are performed in each row. The writing operation is performed in a manner similar to that of the semiconductor device in FIG. 8A. The reading operation is performed as follows. First, a potential at which the transistor 160 is turned off regardless of charge in the gate electrode thereof is supplied to the word lines WL of the rows other than the row where reading is to be performed, so that the transistors 160 of the rows other than the row where reading is to be performed are turned off. Then, a potential (reading potential) at which an on state or an off state of the transistor 160 is determined depending on charge in the gate electrode of the transistor 160 is supplied to the word line WL of the row where reading is to be performed. After that, a constant potential is supplied to the source line SL so that a reading circuit (not illustrated) connected to the bit line BL is operated. Here, conductance between the source lines SL and the bit lines BL is determined by a state of the transistors 160 of the row where reading is to be performed. That is, a potential of the bit line BL, which is read by the reading circuit, depends on charge in the gate electrode of the transistor 160 of the row where reading is to be performed. In such a manner, data can be read from the specified memory cell.

The structures, methods, and the like described in this embodiment can be combined as appropriate with any of the structures, methods, and the like described in the other embodiments.

Embodiment 6

In this embodiment, the case where the semiconductor device described in any of the above embodiments is applied to an electronic device will be described with reference to FIGS. 9A to 9F. In this embodiment, the case where the above semiconductor device is applied to electronic devices such as a computer, a mobile phone handset (also referred to as a mobile phone or a mobile phone device), a personal digital assistant (including a portable game machine, an audio reproducing device, and the like), a camera such as a digital camera or a digital video camera, electronic paper, and a television device (also referred to as a television or a television receiver) will be described.

Figure 9A:
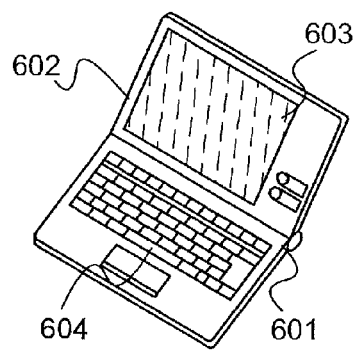
FIGS. 9A to 9F each illustrate an electronic device including a semiconductor device.

FIG. 9A illustrates a notebook personal computer which includes a housing 601, a housing 602, a display portion 603, a keyboard 604, and the like. In the housing 601 and the housing 602, the semiconductor device described in any of the above embodiments is provided. Therefore, a notebook personal computer having characteristics of being small, high-speed operation, and low power consumption can be realized.

Figure 9D:
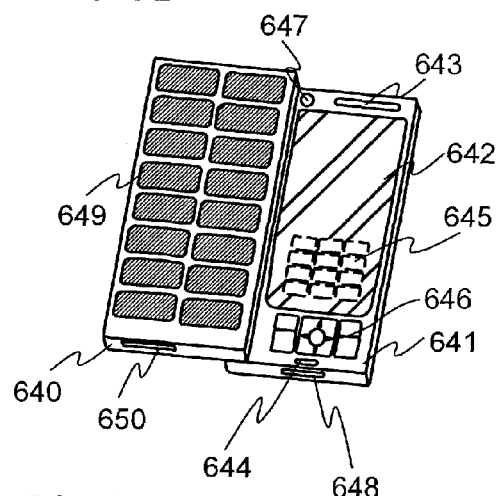
Figure 9B:
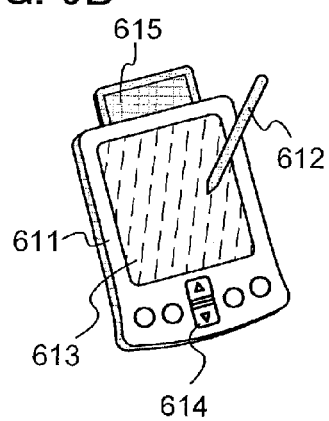

FIG. 9B illustrates a personal digital assistant (PDA) which includes a main body 611 provided with a display portion 613, an external interface 615, operation buttons 614, and the like. In addition, a stylus 612 which controls the personal digital assistant and the like are provided. In the main body 611, the semiconductor device described in any of the above embodiments is provided. Therefore, a personal digital assistant having characteristics of being small, high-speed operation, and low power consumption can be realized.

Figure 9E:
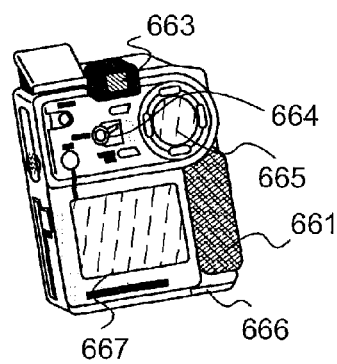
Figure 9C:
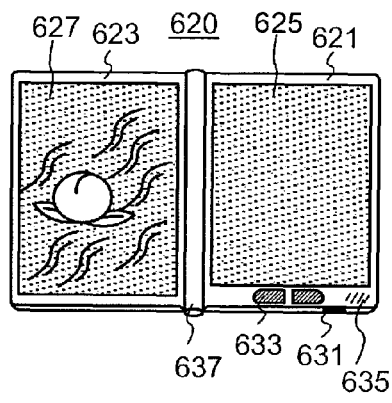

FIG. 9C illustrates an electronic book reader 620 which is mounted with electronic paper and includes two housings, a housing 621 and a housing 623. The housing 621 and the housing 623 are respectively provided with a display portion 625 and a display portion 627. The housing 621 is combined with the housing 623 by a hinge 637, so that the electronic book reader 620 can be opened and closed using the hinge 637 as an axis. The housing 621 is provided with a power button 631, operation keys 633, a speaker 635, and the like. In at least one of the housing 621 and the housing 623, the semiconductor device described in any of the above embodiments is provided. Therefore, an electronic book reader having characteristics of being small, high-speed operation, and low power consumption can be realized.

FIG. 9D illustrates a mobile phone which includes two housings, a housing 640 and a housing 641. Moreover, the housings 640 and 641 in a state where they are developed as illustrated in FIG. 9D can be slid so that one is lapped over the other. Therefore, the size of the mobile phone can be reduced, which makes the mobile phone suitable for being carried around. The housing 641 includes a display panel 642, a speaker 643, a microphone 644, a pointing device 646, a camera lens 647, an external connection terminal 648, and the like. The housing 640 includes a solar cell 649 for charging the mobile phone, an external memory slot 650, and the like. In addition, an antenna is incorporated in the housing 641. In at least one of the housings 640 and 641, the semiconductor device described in any of the above embodiments is provided. Therefore, a mobile phone having characteristics of being small, high-speed operation, and low power consumption can be realized.

FIG. 9E illustrates a digital camera which includes a main body 661, a display portion 667, an eyepiece portion 663, an operation switch 664, a display portion 665, a battery 666, and the like. In the main body 661, the semiconductor device described in any of the above embodiments is provided. Therefore, a digital camera having characteristics of being small, high-speed operation, and low power consumption can be realized.

Figure 9F:
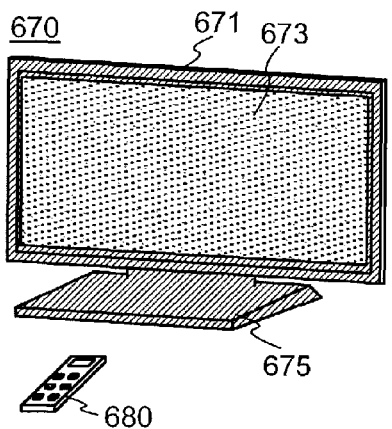

FIG. 9F illustrates a television device 670 which includes a housing 671, a display portion 673, a stand 675, and the like. The television device 670 can be operated with an operation switch of the housing 671 or a remote controller 680. The housing 671 and the remote controller 680 are mounted with the semiconductor device described in any of the above embodiments. Therefore, a television device having characteristics of high-speed operation and low power consumption can be realized.

As described above, the electronic devices described in this embodiment are each mounted with the semiconductor device according to any of the above embodiments. Therefore, an electronic device having characteristics of being small, high-speed operation, and low power consumption can be realized.

Example 1

With the use of a transistor according to the disclosed invention, a semiconductor device in which a short-channel effect is sufficiently suppressed can be realized. The results of confirming the effect by computer simulation will be described with reference to FIGS. 10A to 10C, FIG. 11, and FIG. 12.

In the computer simulation of this example, a transistor whose structure corresponds to the structure in FIG. 1A was used as a model. It was assumed that, in an oxide semiconductor layer, the band gap was 3.15 eV, the relative permittivity was 15, and the electron mobility was 10 cm$^2$/V·s. The electron affinity of a source or drain electrode and the electron affinity of the oxide semiconductor layer were assumed to be equal to each other (4.3 eV). A gate electrode was assumed to be a tungsten layer, and the work function thereof was assumed to be 4.6 eV. A device simulator "Atlas" manufactured by Silvaco Data Systems Inc. was used for the calculation.

Figure 10A:
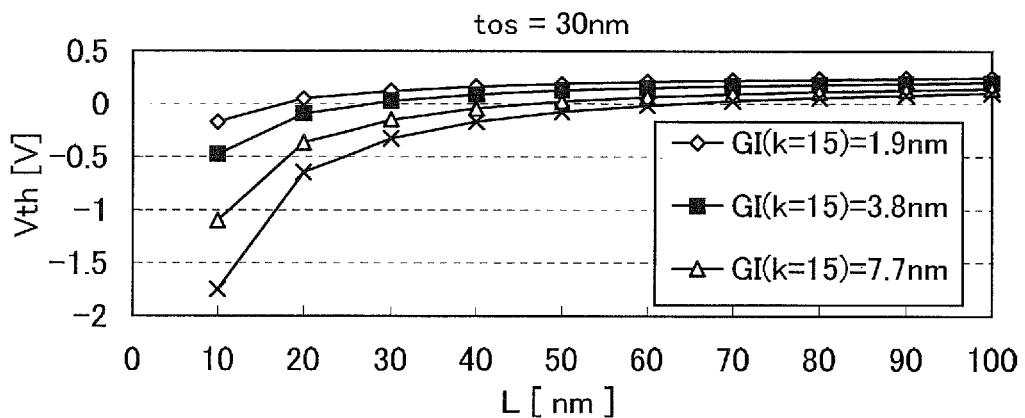
FIGS. 10A to 10C show the calculation results.
Figure 10B:
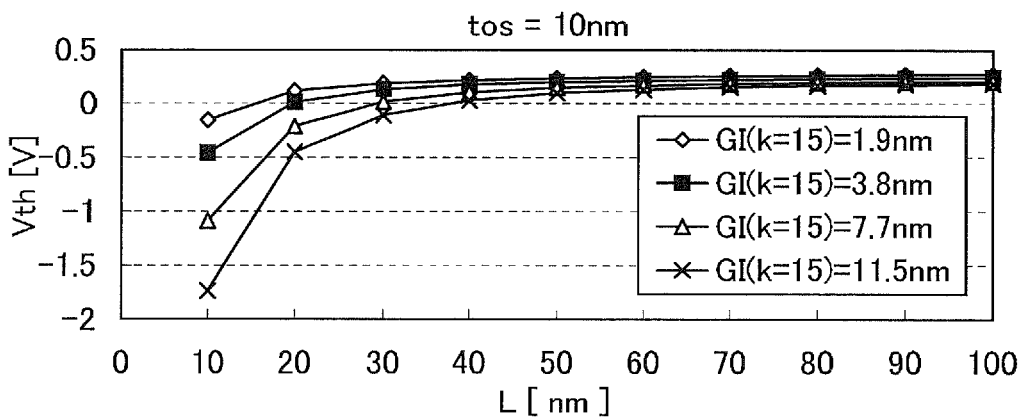
Figure 10C:
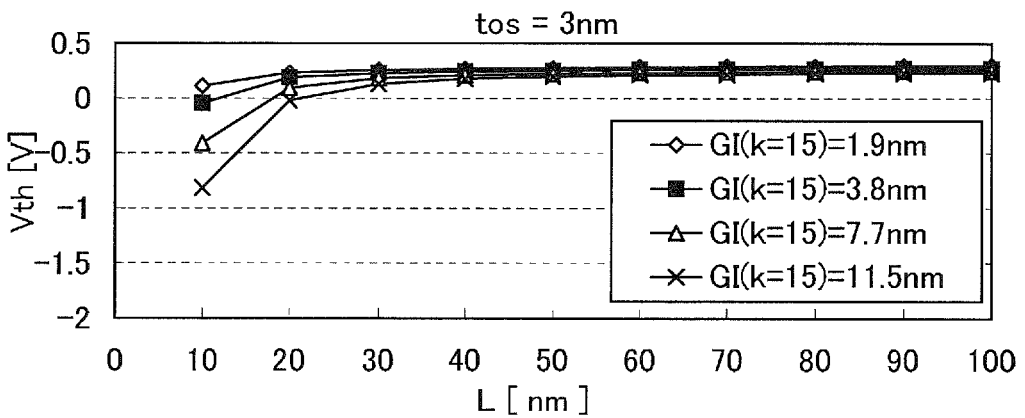

As the parameters according to the calculation, the thickness (tos) of the oxide semiconductor layer, the thickness (d) of a gate insulating layer, the threshold voltage ($V_{th}$) of the transistor, the channel length (L) of the transistor, and the like were used. FIGS. 10A to 10C show the calculation results. In FIGS. 10A to 10C, the horizontal axis represents the channel length L (nm), and the vertical axis represents the threshold voltage $V_{th}$. In FIGS. 10A to 10C, a relation between the channel length L and the threshold voltage $V_{th}$ with respect to four different thicknesses of the gate insulating layers is shown.

Figure 11:
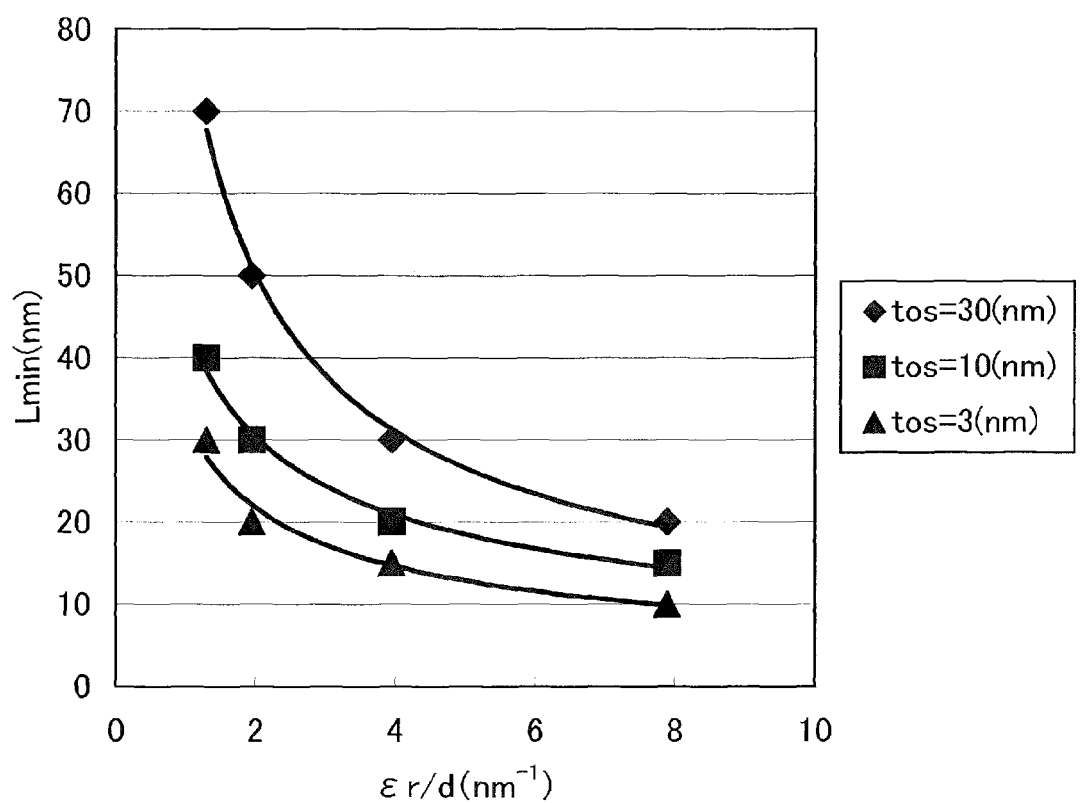
FIG. 11 shows the required lower limit of a channel length L (nm).

From the results shown in FIG. 11, the lower limit of the channel length L (nm) which is necessary to realize a normally-off transistor can be calculated. In FIG. 11, in a relation between the thickness (tos) of the oxide semiconductor layer and the thickness (d) of the gate insulating layer, the lower limit of the channel length L (nm) which is necessary to realize a normally-off transistor is shown. In FIG. 11, the horizontal axis represents a value (nm$^{-1}$) obtained in such a manner that the relative permittivity $\in_r$ is divided by the thickness (d) of the gate insulating layer, and the vertical axis represents an allowable lower limit $L_{min}$ (nm) of the channel length. Note that as the condition for realizing a normally-off transistor, $V_{th}>0$ was employed. That is, FIG. 11 shows a plot of the lower limit of the channel length L which satisfies $V_{th}>0$ in FIGS. 10A to 10C in consideration of the relation between the thickness (tos) of the oxide semiconductor layer and the thickness (d) of the gate insulating layer. Note that curved lines in the drawing are approximate lines.

From FIG. 11, it is found that, in the case where tos is 30 nm, the channel length L is in the range of greater than or equal to 20 (nm) and less than or equal to 70 (nm) when $\in_r/d$ is greater than or equal to 1.3 (nm$^{-1}$) and less than or equal to 7.9 (nm$^{-1}$). In the case where tos is 10 nm, the channel length L is in the range of greater than or equal to 15 (nm) and less than or equal to 40 (nm) when $\in_r/d$ is greater than or equal to 1.3 (nm$^{-1}$) and less than or equal to 7.9 (nm$^{-1}$). In the case where tos is 3 nm, the channel length L is in the range of greater than or equal to 10 (nm) and less than or equal to 30 (nm) when $\in_r/d$ is greater than or equal to 1.3 (nm$^{-1}$) and less than or equal to 7.9 (nm$^{-1}$).

This shows that the channel length L is greater than or equal to 10 (nm) and less than or equal to 70 (nm) in the case where tos is greater than or equal to 3 (nm) and less than or equal to 30 (nm) and $\in_r/d$ is greater than equal to 1.3 (nm$^{-1}$) and less than or equal to 7.9 (nm$^{-1}$).

Figure 12:
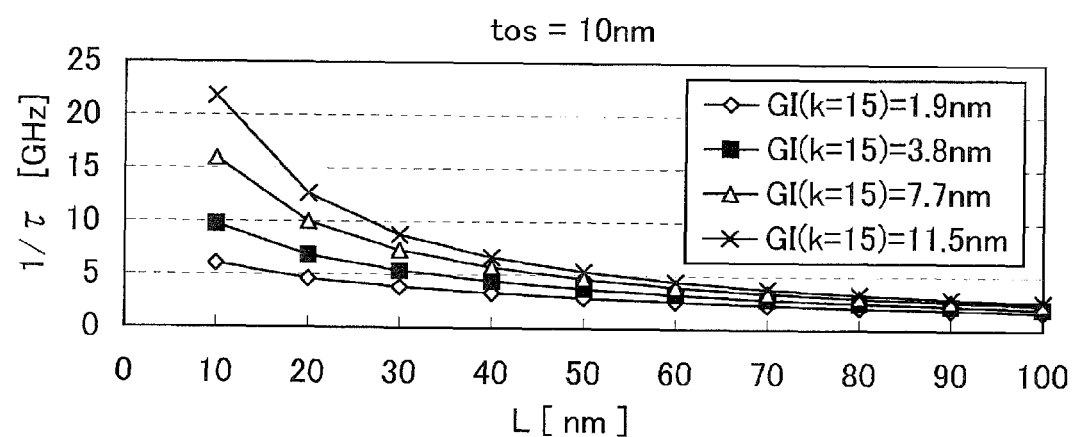
FIG. 12 shows a relation between the switching speed of a transistor and a channel length L thereof.

FIG. 12 shows a relation between the switching speed (the switching frequency) of a transistor according to the disclosed invention and the channel length L thereof. In FIG. 12, the horizontal axis represents the channel length L (nm) and the vertical axis represents the switching speed (GHz). Here, the switching speed is the inverse number of the time τ required for the switching.

For example, it is understood that, when the channel length L is in the range of greater than or equal to 10 (nm) and less than or equal to 70 (nm), high-speed operation where 1/τ is greater than or equal to 1 (GHz) and less than or equal to 20 (GHz) can be realized.

This application is based on Japanese Patent Application serial no. 2009-294738 filed with Japan Patent Office on Dec. 25, 2009, the entire contents of which are hereby incorporated by reference.

EXPLANATION OF REFERENCE

110: transistor, 112: transistor, 114: transistor, 120: memory cell array, 130: memory cell, 131: transistor, 132: capacitor, 140: memory cell array, 150: memory cell, 151: transistor, 152: transistor, 153: transistor, 154: transistor, 155: transistor, 156: transistor, 160: transistor, 162: transistor, 164: capacitor, 190: memory cell, 200: substrate, 202: insulating layer, 206: oxide semiconductor layer, 206a: oxide semiconductor layer, 208a: source or drain electrode, 208b: source or drain electrode, 212: gate insulating layer, 214: gate electrode, 216: interlayer insulating layer, 218: interlayer insulating layer, 250: transistor, 300: substrate, 302: insulating layer, 304: oxide semiconductor layer, 304a: oxide semiconductor layer, 305: oxide semiconductor layer, 306: oxide semiconductor layer, 306a: oxide semiconductor layer, 308a: source or drain electrode, 308b: source or drain electrode, 312: gate insulating layer, 314: gate electrode, 316: interlayer insulating layer, 318: interlayer insulating layer, 350: transistor, 400: substrate, 402: insulating layer, 406: oxide semiconductor layer, 406a: oxide semiconductor layer, 408: conductive layer, 408a: source or drain electrode, 408b: source or drain electrode, 410: insulating layer, 410a: insulating layer, 410b: insulating layer, 411a: oxide region, 411b: oxide region, 412: gate insulating layer, 414: gate electrode, 416: interlayer insulating layer, 418: interlayer insulating layer, 450: transistor, 500: substrate, 502: insulating layer, 504a: oxide semiconductor layer, 506a: oxide semiconductor layer, 508a: source or drain electrode, 508b: source or drain electrode, 510a: insulating layer, 510b: insulating layer, 511a: oxide region, 511b: oxide region, 512: gate insulating layer, 514: gate electrode, 516: interlayer insulating layer, 518: interlayer insulating layer, 550: transistor, 601: housing, 602: housing, 603: display portion, 604: keyboard, 611: main body, 612: stylus, 613: display portion, 614: operation button, 615: external interface, 620: electronic book reader, 621: housing, 623: housing, 625: display portion, 627: display portion, 631: power button, 633: operation key, 635: speaker, 637: hinge, 640: housing, 641: housing, 642: display panel, 643: speaker, 644: microphone, 646: pointing device, 647: camera lens, 648: external connection terminal, 649: solar cell, 650: external memory slot, 661: main body, 663: eyepiece portion, 664: operation switch, 665: display portion, 666: battery, 667: display portion, 670: television device, 671: housing, 673: display portion, 675: stand, and 680: remote controller

The invention claimed is:

1. A semiconductor device comprising:
an oxide semiconductor layer;
a source electrode and a drain electrode electrically connected to the oxide semiconductor layer;
a first insulating layer over the source electrode and the drain electrode;
a gate insulating layer over the oxide semiconductor layer; and
a gate electrode over the gate insulating layer,
wherein the gate insulating layer is located between a side surface of the first insulating layer and the gate electrode.

2. The semiconductor device according to claim 1,
wherein the gate insulating layer is in contact with the side surface of the first insulating layer.

3. The semiconductor device according to claim 1,
wherein the first insulating layer is divided into a first region and a second region, and
wherein the first region and the second region are provided on the source electrode and the drain electrode, respectively.

4. The semiconductor device according to claim 1,
wherein the first insulating layer is divided into a first region and a second region,
wherein the first region and a first portion of the gate insulating layer are provided between the source electrode and the gate electrode, and
wherein the second region and a second portion of the gate insulating layer are provided between the drain electrode and the gate electrode.

5. The semiconductor device according to claim 1, further comprising a second insulating layer over the first insulating layer, the gate insulating layer and the gate electrode,
wherein the second insulating layer comprises aluminum oxide.

6. The semiconductor device according to claim 1,
wherein the oxide semiconductor layer includes a crystal region, and
wherein a c-axis of the crystal region is aligned in a direction within ±10° from a perpendicular direction to a surface of the oxide semiconductor layer.

7. The semiconductor device according to claim 1,
wherein a thickness of the oxide semiconductor layer is greater than or equal to 1 nm and less than or equal to 50 nm,
wherein the gate insulating layer satisfies a relation where $\in_r/d$ is greater than or equal to 0.08 $(nm^{-1})$ and less than or equal to 7.9 $(nm^{-1})$ when a relative permittivity of a material used for the gate insulating layer is $\in_r$ and a thickness of the gate insulating layer is d, and
wherein a distance between the source electrode and the drain electrode is greater than or equal to 10 nm and less than or equal to 1 μm.

8. The semiconductor device according to claim 1,
wherein each side surface of the source electrode and the drain electrode has an oxide region.

9. A semiconductor device comprising:
a first oxide semiconductor layer;
a second oxide semiconductor layer on the first oxide semiconductor layer;
a source electrode and a drain electrode electrically connected to the second oxide semiconductor layer;
a first insulating layer over the source electrode and the drain electrode;
a gate insulating layer over the second oxide semiconductor layer; and
a gate electrode over the gate insulating layer,
wherein the gate insulating layer is located between a side surface of the first insulating layer and the gate electrode.

10. The semiconductor device according to claim 9,
wherein the gate insulating layer is in contact with the side surface of the first insulating layer.

11. The semiconductor device according to claim 9,
wherein the first insulating layer is divided into a first region and a second region, and
wherein the first region and the second region are provided on the source electrode and the drain electrode, respectively.

12. The semiconductor device according to claim 9,
wherein the first insulating layer is divided into a first region and a second region,
wherein the first region and a first portion of the gate insulating layer are provided between the source electrode and the gate electrode, and
wherein the second region and a second portion of the gate insulating layer are provided between the drain electrode and the gate electrode.

13. The semiconductor device according to claim 9, further comprising a second insulating layer over the first insulating layer, the gate insulating layer and the gate electrode,
wherein the second insulating layer comprises aluminum oxide.

14. The semiconductor device according to claim 9,
wherein the second oxide semiconductor layer include a crystal region, and
wherein a c-axis of the crystal region is aligned in a direction within ±10° from a perpendicular direction to a surface of the second oxide semiconductor layer.

15. The semiconductor device according to claim 9,
wherein the second oxide semiconductor layer includes a crystal region, and
wherein the crystal region includes a layer containing In and a layer containing Ga or Zn which are stacked in a c-axis direction of the crystal region.

16. The semiconductor device according to claim 9,
wherein the first oxide semiconductor layer and the second oxide semiconductor layer have a same crystal structure.

17. The semiconductor device according to claim 9,
wherein the first oxide semiconductor layer and the second oxide semiconductor layer comprise a material including the same main component.

18. The semiconductor device according to claim 9,
wherein the semiconductor device is provided over a surface having an arithmetic mean deviation of 1 nm or less.

19. The semiconductor device according to claim 9,
wherein a sum of a thickness of the first oxide semiconductor layer and the second oxide semiconductor layer is greater than or equal to 1 nm and less than or equal to 50 nm, wherein the gate insulating layer satisfies a relation where $\epsilon_r/d$ is greater than or equal to 0.08 $(nm^{-1})$ and less than or equal to 7.9 $(nm^{-1})$ when a relative permittivity of a material used for the gate insulating layer is $\epsilon_r$ and a thickness of the gate insulating layer is d, and wherein a distance between the source electrode and the drain electrode is greater than or equal to 10 nm and less than or equal to 1 μm.

20. The semiconductor device according to claim 9, wherein each side surface of the source electrode and the drain electrode has an oxide region.

\* \* \* \* \*